United States Patent [19]
Bradley et al.

[11] Patent Number: 5,642,039
[45] Date of Patent: Jun. 24, 1997

[54] HANDHELD VECTOR NETWORK ANALYZER

[75] Inventors: Donald A. Bradley, Morgan Hill; Frank Tiernan, Saratoga, both of Calif.

[73] Assignee: Wiltron Company, Morgan Hill, Calif.

[21] Appl. No.: 362,179

[22] Filed: Dec. 22, 1994

[51] Int. Cl.$^6$ ............... G01R 23/16; H03L 7/23; H04B 17/00
[52] U.S. Cl. ............... 324/76.53; 324/76.41; 324/76.43; 324/76.19; 324/646; 331/2; 331/22; 364/485
[58] Field of Search ............... 324/612, 615, 324/76.19, 76.23, 76.26, 76.27, 76.39, 637, 642, 646, 76.41, 76.43, 76.52, 76.53, 76.56; 327/105; 331/2, 22; 364/485, 553

[56] References Cited

U.S. PATENT DOCUMENTS

| | | | |
|---|---|---|---|
| 3,808,526 | 4/1974 | Jackson | 324/615 |
| 4,510,440 | 4/1985 | Ryder | 324/76.19 |
| 4,527,116 | 7/1985 | Sorba et al. | 324/76.19 |
| 4,603,304 | 7/1986 | Burns et al. | 331/2 |
| 4,626,787 | 12/1986 | Mefford | 331/22 X |
| 4,742,566 | 5/1988 | Nordholt et al. | 331/22 X |
| 4,868,494 | 9/1989 | Ryder et al. | 324/76.41 |
| 4,943,787 | 7/1990 | Swapp | 331/2 |
| 5,016,202 | 5/1991 | Seibel et al. | 364/571.07 |
| 5,140,703 | 8/1992 | Payne | 324/76.19 X |
| 5,210,484 | 5/1993 | Remillard et al. | 324/76.41 |
| 5,317,284 | 5/1994 | Yang | 331/2 |
| 5,434,888 | 7/1995 | Fukuchi | 331/2 X |

*Primary Examiner*—Kenneth A. Wieder
*Assistant Examiner*—Glenn W. Brown
*Attorney, Agent, or Firm*—Fliesler, Dubb, Meyer & Lovejoy

[57] ABSTRACT

A handheld vector network analyzer (VNA) providing a wide bandwidth test signal $F_O$ utilizing a narrowband test signal synthesizer which provides the test signal through a frequency divider or harmonic generator. With a 550–1100 MHz narrowband test signal synthesizer, a test signal $F_O$ can range from 25 MHz to 3.3 GHz. To make a tracking synthesizer operate more independent of the test signal synthesizer, a LO signal is produced using the tracking synthesizer with its phase detector input connected through a frequency divider to the output of the test signal synthesizer. Synchronous detectors are further included which provide incident and reflected IF signals to take advantage of the maximum range of an A/D converter. To better enable operation in the presence of external signals, feedback is provided from the synchronous detectors to sweep the frequency of a reference oscillator.

27 Claims, 12 Drawing Sheets

HANDHELD VECTOR NETWORK ANALYZER

BACKGROUND OF THE INVENTION

1. Field of the Invention

The present invention relates to a vector network analyzer (VNA). More particularly, the present invention relates to reduction of size, power consumption and weight of components used in the VNA. The present invention also more particularly relates to configuration of the VNA to enable improved operation the presence of external signals.

2. Description of the Related Art

Recently, use of wireless networks for telephone or computer local area network (LAN) communications are being adopted worldwide in the 0–3 GHz frequency range. For instance, cellular telephones in the United States operate in the 800 MHz range. Further, in the United States, the Federal Communications Commission (FCC) has allocated five frequency bands 1850–1990, 2110–2150 and 2160–2200 MHz for emerging technologies which includes personal communications services (PCS). PCS includes sophisticated pocket telephones which will work anywhere—indoors and outdoors, at home or at work or while traveling. PCS also includes wireless LANs.

The wireless communications networks such as cellular telephones or PCS require remotely located antennas or "cells" to provide services to individual users. To reduce service costs for the remote antennas, it is desirable to test the remote antenna and its associated microwave components at its remote location and locate and repair portions which fail. Unfortunately, test devices which make both amplitude and phase measurements, referred to as vector network analyzers (VNAs), which can be easily hand carried by one person are not currently available.

VNAs enable a user to easily identify a fault and to measure the distance from the test device to a fault or discontinuity. A fault may result from environmental conditions such as corrosion of a connector, or from faulty installation or repair, for example, where a coaxial cable is punctured by an installer. Test measurements are first typically made using a VNA operating in the frequency domain to determine whether a fault exists as indicated by an undesirable standing wave ratio (SWR). If a fault is discovered, an analysis of the results derived from the frequency domain measurement is made in the time domain to locate the position of the fault.

A VNA also enables calibration to extend the test port connection to the end of a cable connected to the test port. By using a VNA to extend the test port to the end of the cable, errors in the cable will not be taken into account when measuring a device through the cable. Scaler devices which measure only amplitude do not enable extension of the test port to the end of a cable.

Because a remote antenna may be constantly providing signals for communications devices once it is installed, it is desirable that the remote antenna not be disabled for testing. By measuring both phase and amplitude, a VNA provides the ability to distinguish extraneous signals, enabling tests to be performed with the remote antenna active. Scaler devices cannot distinguish the extraneous signals, requiring that scaler tests be performed with the remote antenna disabled.

As mentioned above, VNAs are large and not easily transportable. Current VNAs have a housing greater than two feet on a side and with a power supply may weigh 50 pounds or more. The VNAs are typically transported by truck to the remote antenna sight and carried by two people to the remote antenna. With remote antennas located on top of towers, transportation of the large VNA proves especially difficult.

The large size and weight of current VNAs is due to the size of synthesizers required to produce the test signal for the VNAs. To provide a test signal over the broad frequency spectrum, such as 0–3 GHz, current analyzers mix a signal from a narrower frequency band synthesizer. However, such mixing requires the narrower bandwidth synthesizer to operate at a much higher frequency than the maximum test signal frequency desired. Increasing the frequency of the narrowband synthesizer is undesirable because it requires the size, weight and power consumption of the narrowband synthesizer to increase.

FIG. 1 shows prior art circuitry for a downconverter used in a VNA which provides a 0–1 GHz test signal. As shown, the downconverter utilizes a 2.5–3.5 GHz narrowband synthesizer to obtain the 0–1 GHz test signal. FIG. 1 illustrates that to obtain a given test signal frequency range, the required synthesizer must provide a maximum frequency greater than three times the maximum frequency of the given test signal to avoid spurious mixing products in the signal.

FIG. 2 shows prior art test signal generation circuitry for an analyzer configured to provide a 0–3 GHz test signal. As shown, to produce the 0–3 GHz test signal, the circuitry of FIG. 2 requires synthesizers or phase-locked loops (PLLs) 200, 210 and 220 all operating at 10 GHz or higher, a frequency greater than three times the maximum required test signal frequency of 3 GHz. The output signal from the 10–13 GHz oscillator 202 of synthesizer 200 is mixed with a signal from 10 GHz oscillator 212 of synthesizer 210 in mixer 230 to obtain the 0–3 GHz test signal similar to the circuitry of FIG. 1. The additional oscillator 222 in synthesizer 220 operating at 10.001 GHz has its output mixed in mixer 232 with the output of synthesizer 202 to provide a 0–3 GHz+1 MHz LO signal used to produce an IF signal for the VNA.

Synthesizers, or PLLs 200, 210 and 220 each include a phase detector with a first input receiving a reference signal from a 1 MHz oscillator 234. A second input of each phase detector is connected to its respective oscillator 202, 212 and 222 through a divide-by-N frequency divider, where N is set to convert the signal from its respective oscillator to a 1 MHz signal. The output of the phase detector is provided through an amplifier and low pass filter back to the voltage control input of its respective oscillator.

To provide incident and reflected test signals, the 0–3 GHz signal from mixer 230 is provided through an amplifier and filter 236 to the input of a splitter 238. Splitter 238 has a first output branch providing a test signal through coupler 240 to test port 242. The coupler 240 is connected to provide reflected signals from the test port 242 to a first input of mixer 244. The second output of the splitter 238 provides an incident signal to a first input of mixer 246. Second inputs of mixers 244 and 246 receive the LO signal from the output of mixer 232 through an amplifier and filter 248. The outputs of mixers 244 and 246 provide respective reflected and incident 1 MHz IF signals to a digital signal processor (DSP) 250. The DSP enables determination of both amplitude and phase characteristics of the test signal reflected from a device connected to test port 242.

SUMMARY OF THE INVENTION

The present invention provides a handheld VNA with dimensions equal to or less than 8 inches by 6 inches by 2½ inches and a weight of less than three pounds, including batteries, when a test signal from 25 MHz to 3.3 GHz is desired. With such weight and size, the VNA of the present invention is easily transportable by one person to make test measurements at a remote sight.

Reduction in size from conventional VNAs is enabled utilizing a downconverter of the present invention which does not require a synthesizer to have a maximum frequency substantially greater than the maximum frequency of the desired test signal.

The VNA of the present invention further includes circuitry enabling operation in the presence of external signals with less possibility of interference causing errors than with conventional test devices.

The present invention further includes synchronous detectors which replace the DSP, such as DSP 250 of FIG. 2, the synchronous detectors providing incident and reflected IF signals taking advantage of the maximum range of an A/D converter.

The present invention is a handheld vector network analyzer (VNA) operating over a wide bandwidth, such as from 25 MHz to 3.3 GHz, the frequency range being adjustable to meet the range of frequencies of devices for which the VNA is used to test. Size of the VNA of the present invention is reduced from conventional VNAs having a similar output frequency range by using both a downconverter and an upconverter. The downconverter includes a narrowband test signal synthesizer with an output coupled to a frequency divider, such as divide by $2^N$ dividers, to produce a test signal. The upconverter utilizes a harmonic generator having an input also coupled to the narrowband test signal synthesizer. For instance with a 25 MHz to 3.3 GHz test signal range, utilizing the present invention, a narrowband test signal synthesizer may be provided having a range of 550 to 1100 MHz.

To make a tracking synthesizer operate more independent of the test signal synthesizer, a phase detector of the tracking synthesizer of the present invention, similar to 222 of FIG. 2, is not connected to a reference oscillator, such as 234 of FIG. 2. Instead the phase detector of the tracking synthesizer of the present invention is connected through a frequency divider to the output of the narrowband test signal synthesizer.

The present invention further utilizes synchronous detectors to replace a DSP. The synchronous detectors receive IF signals in one end of a series of multipliers from harmonic samplers or mixers, such as mixers 244 and 246 of FIG. 2. Second ends of the multipliers are provided with signals from a PLL having outputs separated by 90 degrees enabling the multipliers to produce both real and imaginary incident and reflected signals. Integrators couple the real and imaginary incident and reflected signals to an A/D converter. A comparator output provides an input to a phase detector of the PLL of the synchronous detectors, the comparator having one input receiving the IF signal and a second input receiving the output of the incident imaginary signal integrator to assure the incident imaginary signal is servoed to zero and the incident real signal achieves its maximum value.

To enable utilization of the maximum range of the A/D converter, an additional comparator is used to compare the incident real signal integrator output to a reference voltage to assure the incident real signal range corresponds with the A/D converter maximum range.

To enable reduced measurement error in the presence of external signals over conventional VNA's, a reference oscillator, similar to 234 of FIG. 2, receives a control feedback from the incident real signal integrator output. Since the incident real signal integrator output is controlled to extend a full range of the A/D converter for each measurement, the reference oscillator of the present invention can sweep its entire range for each measurement. The reference oscillator sweep is chosen to be ±100 parts per million of a reference frequency reducing the likelihood of interference with an external signal. The reference oscillator is connected to the test signal synthesizer, similar to the connection of 234 to synthesizer 210 of FIG. 2.

BRIEF DESCRIPTION OF THE DRAWINGS

Further details of the present invention are explained with the help of the attached drawings in which.

DETAILED DESCRIPTION

Figure 3:
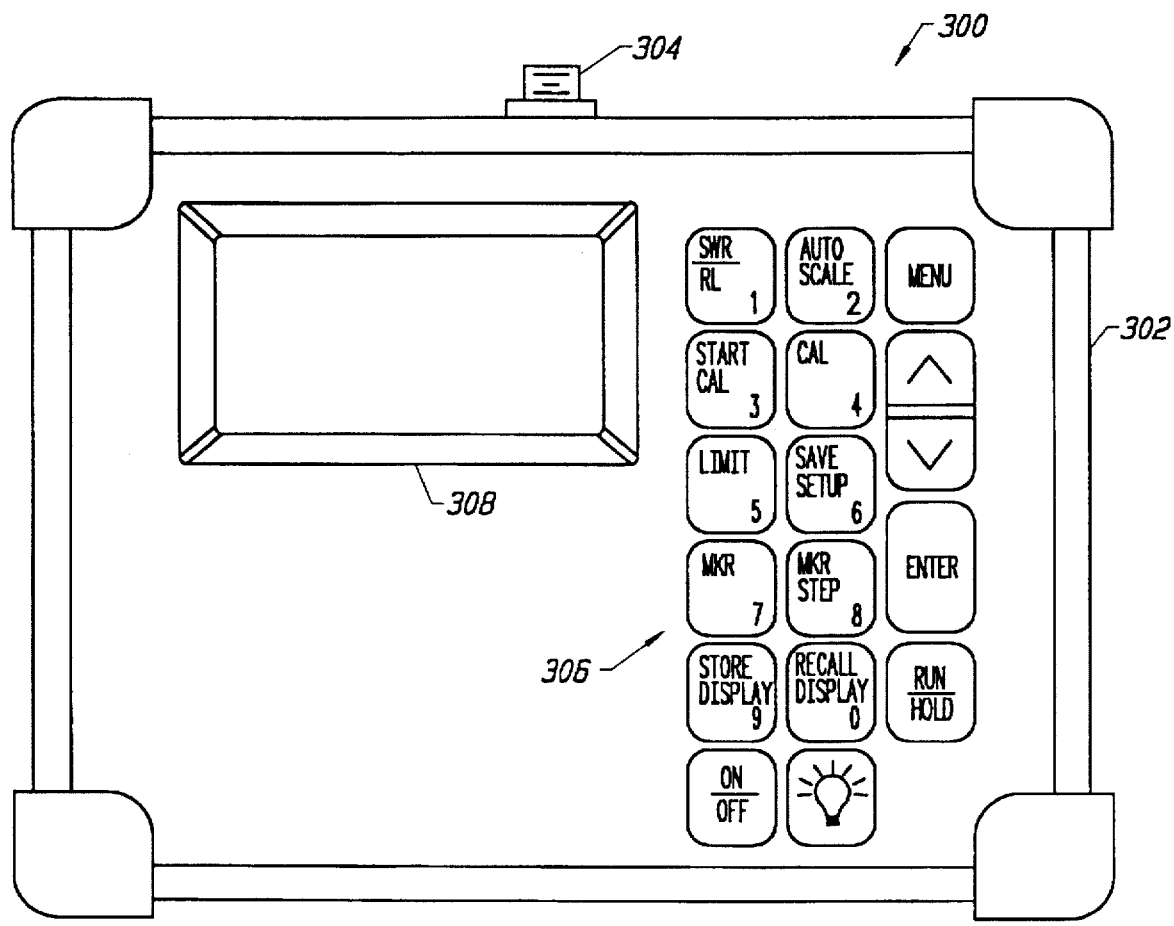
FIG. 3 shows the exterior of a handheld vector network analyzer of the present invention.
Figure 4:
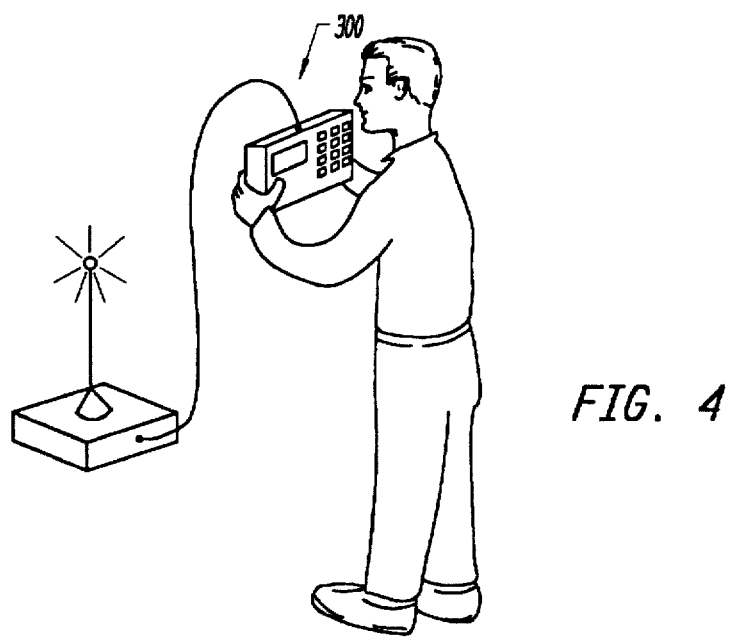
FIG. 4 illustrates how a VNA of the present invention is handheld and may be utilized at a remote antenna sight to enable vector testing of the antenna in the presence of signals being received by the remote antenna.

FIG. 3 shows the exterior of a handheld vector network analyzer (VNA) 300 of the present invention. The configuration of components in the VNA 300 of the present invention enables the size of the VNA housing 302 to have an approximate length of 6 inches, width of 8 inches and depth of 2½ inches when a test signal from 25 MHz to 3.3 GHz is desired. Further, components contained within the VNA enable the VNA to weigh less than 3 pounds, including weight of the batteries. With such small dimensions and low weight, the VNA 300 of the present invention is handheld and easily portable to a remote antenna sight to enable vector testing of the remote antenna and its associated microwave components as illustrated in FIG. 4.

FIG. 3 shows the VNA 300 having a single port test port 304, although more than one port VNAs which are handheld may be constructed utilizing components described herein. Further, as shown in FIG. 3, the housing 302 of the VNA 300 enables user access to a keypad 306 and display 308.

As illustrated by FIG. 3, the handheld VNA of the present invention includes easy to use controls for steps such as selecting a desired frequency range using the arrow keys and calibration which can be performed by first pressing the START CAL button and then individually connecting a short, open and load and pressing the (CAL) button after each is connected. The handheld VNA also provides controls for measuring a standing wave ratio (SWR) and return loss (RL).

Figure 5:
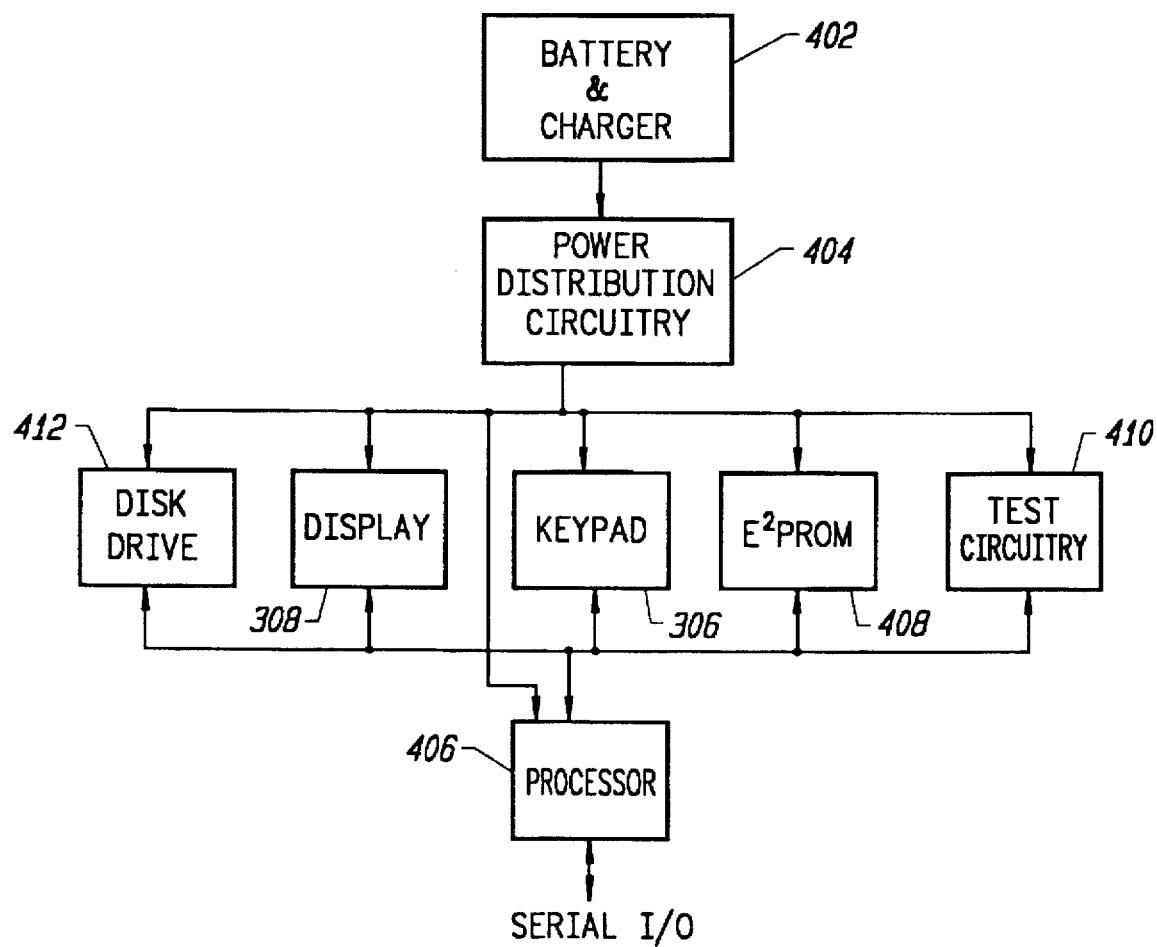
FIG. 5 shows a block diagram further illustrating components utilized in the VNA of the present invention.

FIG. 5 shows a block diagram further illustrating components utilized in the VNA 300 of the present invention. Because the VNA is designed for use at a remote location, as shown in FIG. 5, power is provided to the VNA by battery 402 having an associated charger. Power distribution circuitry 404 provides power from the battery 402 to electrical circuitry of the VNA. Because the present invention is configured to make measurements in the presence of signals received by an antenna under test as described below, the power distribution circuitry 404 may be configured to provide power for measurements using a low output powered signal so that there is less possibility of interference with normal communications on the device under test.

Electrical circuitry to which power is distributed by power distribution circuitry 404, in addition to the keypad 306 and display 308 of FIG. 3, includes a processor 406, a EEPROM 408, test circuitry 410, and an optional disk drive 412.

The processor 406 utilized is an 8051microcontroller which includes its own internal memory. The processor memory includes both a scratchpad memory as well as a programmable read only memory (PROM). The memory of the processor 406 is utilized to store control software as well as software containing a distance to fault calculation program and a vector error correction or calibration program. As shown connected to processor 406, the VNA also includes a serial I/O data port to enable communication to a personal computer for further data manipulation or archiving.

The EEPROM 408 is an electrically programmable and erasable PROM provides additional memory to the internal memory of processor 406. The PROM is programmed to store test results, for example including as many as seven displays of information.

The optional disk drive 412 is a floppy disk drive enabling test measurements to be made at a remote sight and stored on a floppy disk. The floppy disk may then later be removed and easily transferred to a computer for further analysis of test data upon return from a remote test sight. Without the floppy disk, the 2½ depth dimension discussed previously for the housing 302 of FIG. 3 can be reduced.

The test circuitry 410 includes components which generate, send and receive test signals and process the test signals to enable test measurements to be made. To keep size and weight of the VNA to a minimum, the test circuitry 410 utilizes a narrow swept frequency range covering the frequencies desired for testing, for example 0.025–3.3 GHz for cellular and PCS technology discussed in the background. With current technology, however, by utilizing test circuitry depicted in FIG. 2, the test circuitry 410 would be much too large to fit within the confines of a housing as shown in FIG. 3.

Figure 1:
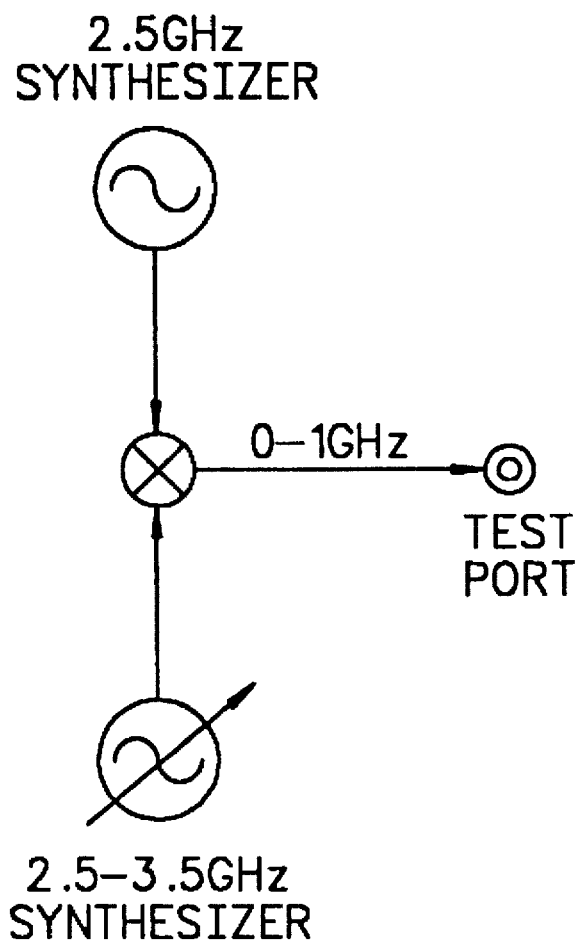
FIG. 1 shows prior art circuitry for a downconverter used in a VNA which provides a 0–1 GHz test signal.
Figure 6:
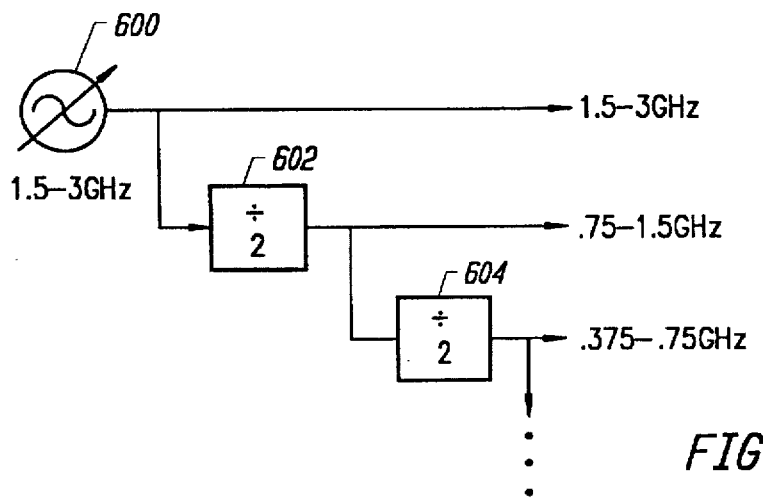
FIG. 6 shows a downconverter utilized in the present invention providing an alternative to the downconverter of FIG. 1.

FIG. 6 shows a downconverter utilized in the present invention to provide an alternative to the downconverter of FIG. 1 and enable test circuitry size to be reduced. As shown, the downconverter of FIG. 6 utilizes a 1.5–3 GHz test signal synthesizer 600 to generate a 0–3 GHz test signal, and does not require a test signal synthesizer with a maximum frequency greater than three times the maximum test signal as in the prior art described previously. To provide the test signal, the output of test signal synthesizer 600 is provided directly to an output as well as through series connected divide by two frequency dividers 602, 604, etc. The output of each divide by two frequency divider is provided as an output to complete generation of the 0–3 GHz test signal. Note that although divide by two frequency dividers are shown, divide by any number N frequency dividers may be used to provide the same effect.

Test Circuitry—First Embodiment

Figure 7:
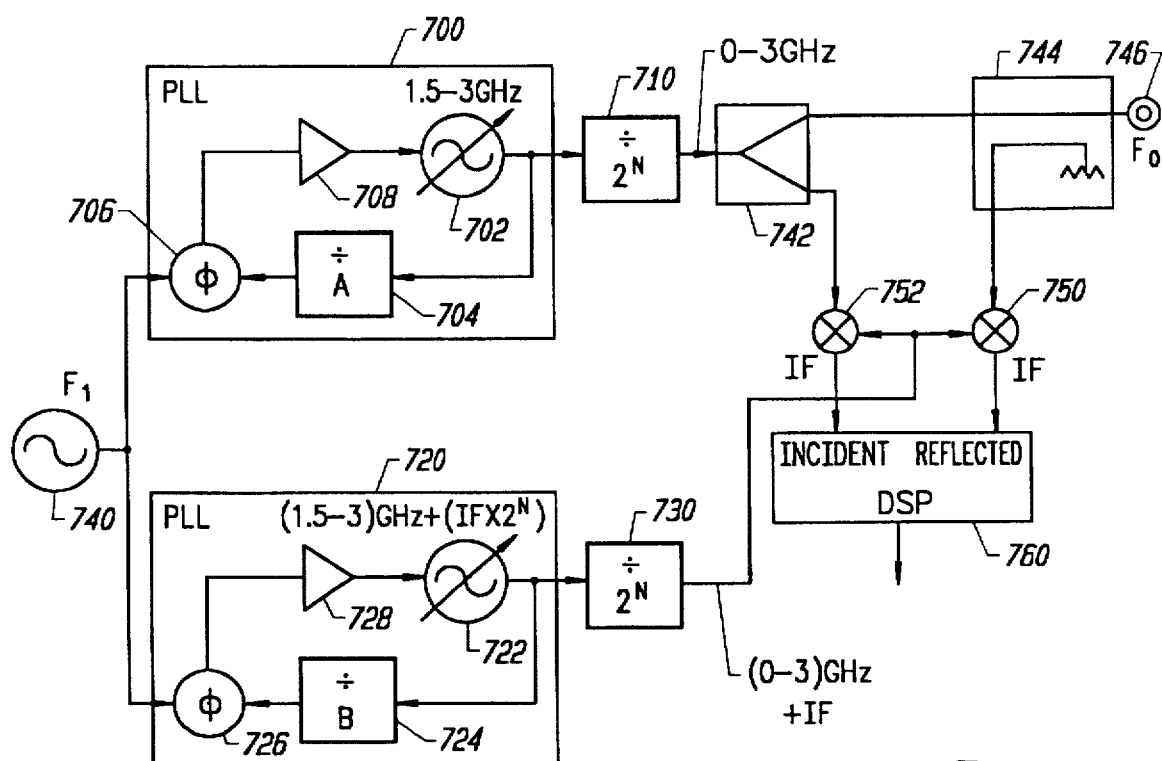
FIG. 7 shows a first embodiment of test circuitry of the present invention utilizing downconverters as shown in FIG. 6.

FIG. 7 shows a first embodiment of test circuitry of the present invention utilizing downconverters as shown in FIG. 6. As shown the test circuitry includes two downconverters, a first including a 1.5–3 GHz test signal synthesizer 700 followed by a divide-by-$2^N$ frequency divider 710 and a second including a 1.5–3 GHz plus an IF frequency times $2^N$ frequency tracking synthesizer 720 followed by a divide-by-$2^N$ frequency divider 730.

Figure 2:
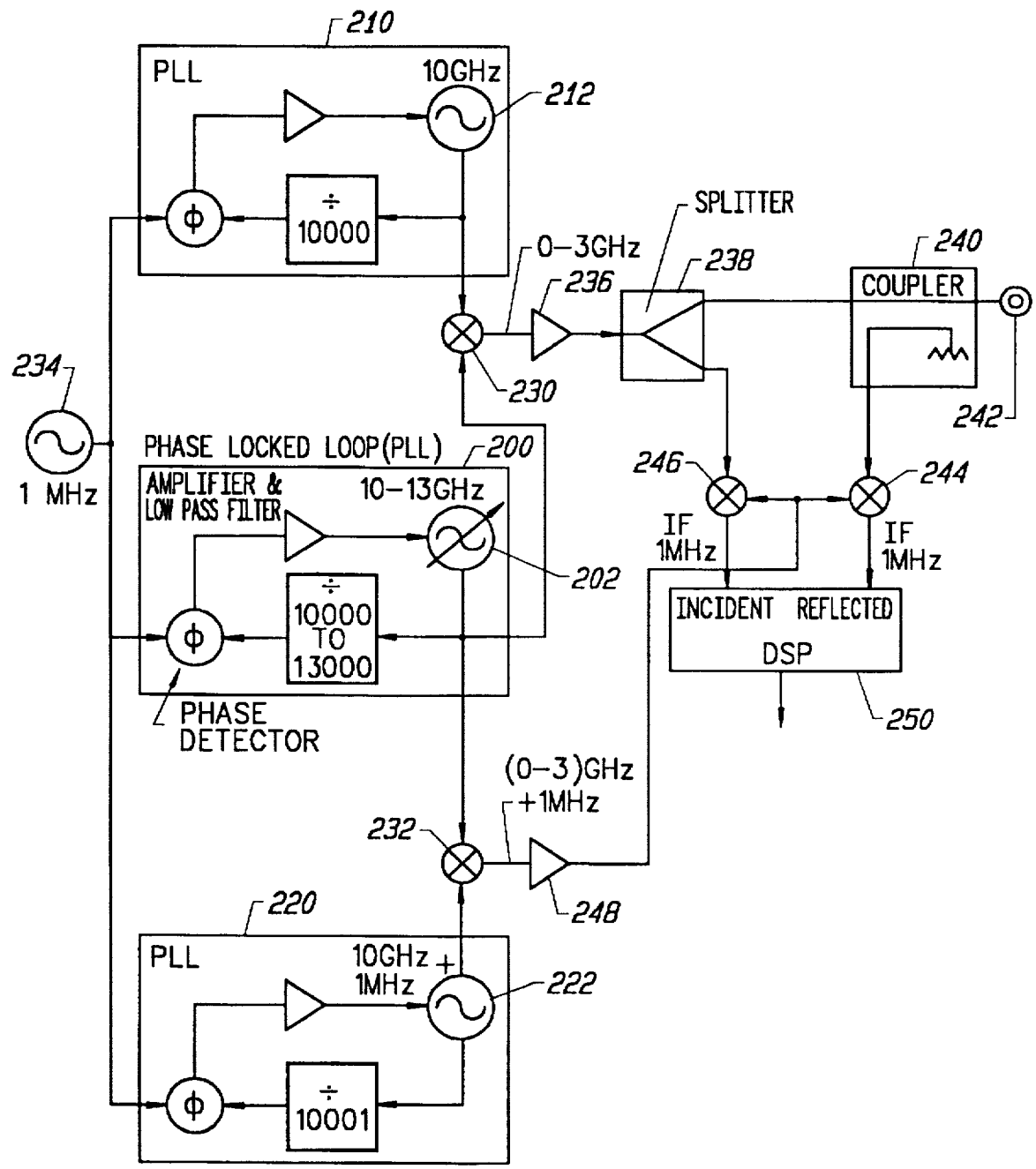
FIG. 2 shows prior art test signal generation circuitry for an analyzer configured to provide a 0–3 GHz test signal.

Similar to FIG. 2, each of frequency synthesizers 700 and 720 include respective oscillators 702 and 722 and phase detectors 706 and 726. A first input of each of phase detectors 706 and 726 is connected to a reference signal output of reference oscillator 740 which operates at a desired reference frequency $F_1$. A second input of each of phase detectors 706 and 726 is connected through a respective frequency divider 704 and 724 to the output of its respective oscillator to divide the frequency of its oscillator output by a number set to provide an output matching the frequency of oscillator 740. Outputs of each of phase detectors 706 and 726 are provided through a respective amplifier and low pass filter 708 and 728 to the voltage control input of its respective oscillator.

Frequency dividers 710 and 730 are shown as divide by $2^N$ devices. However, as in FIG. 6, frequency dividers 710 and 730 may also divide by other numbers. The output of frequency divider 710, thus, produces a test signal in the 0–3 GHz frequency range. The output of frequency divider 730 produces a similar signal in the range 0–3 GHz with the IF frequency added to provide a LO signal.

To provide incident and reflected test signals, the 0–3 GHz signal from frequency divider 710 is provided to the input of a splitter 742. Splitter 742 has a first output branch providing the test signal $F_O$ through coupler 744 to test port 746. The coupler is connected to provide reflected signals from the test port 746 to a first input of mixer 750. The second output of the splitter 742 provides an incident signal to a first input of mixer 752. Second inputs of mixers 750 and 752 receive the LO signal from the output of frequency divider 730. The outputs of mixers 750 and 752 provide respective reflected and incident IF signals to a digital signal processor (DSP) 760. The DSP determines both amplitude and phase characteristics of the test signal reflected from a device connected to test port 246.

Note that although synthesizers 700 and 720 are shown to operate in the range of 1.5–3 GHz to enable production of a 0–3 GHz test signal, synthesizers 700 and 720 may operate at other frequency ranges. Similarly, although frequency dividers 710 and 730 are shown as $2^N$ dividers, these dividers may be divide by any number.

In operation oscillator 702 is controlled to operate at a desired frequency in it's 1.5–3 GHz range, and an output of one of the frequency divider 710 is selected to provide a desired $F_O$ signal in the 0–3 GHz range.

Likewise, oscillator 722 is controlled to operate at the frequency of oscillator 702 plus a value equal to the IF frequency times the $2^N$ value used in frequency divider 710. Frequency divider 730 is set to correspond with frequency divider 710.

Values for A and B are chosen in respective frequency dividers 704 and 724 so that the frequency of the output of respective oscillators 702 and 722 are divided down to match the IF signal. Phase detectors 706 and 726 then serve to provide a signal to the voltage control input of oscillators 702 and 722 to synchronize their phase with oscillator 740.

Power splitter 742 splits the signal from frequency divider 710 into two components. A first component is provided through coupler 744 to form the test signal $F_O$ provided to a device connected to port 746 for testing. A reflected signal from the device under test is then received by coupler 744 and directed to a first input of mixer 750. A second component from splitter 742 is provided as the incident signal directly to a first input of mixer 752.

By mixing the incident and reflected signals originating from frequency divider 710 in mixers 752 and 750 with the LO signal from frequency divider 730, the mixers 750 and 752 provide the reflected and incident test signals at the IF frequency to DSP 760.

Test Circuitry—Second Embodiment

Figure 8:
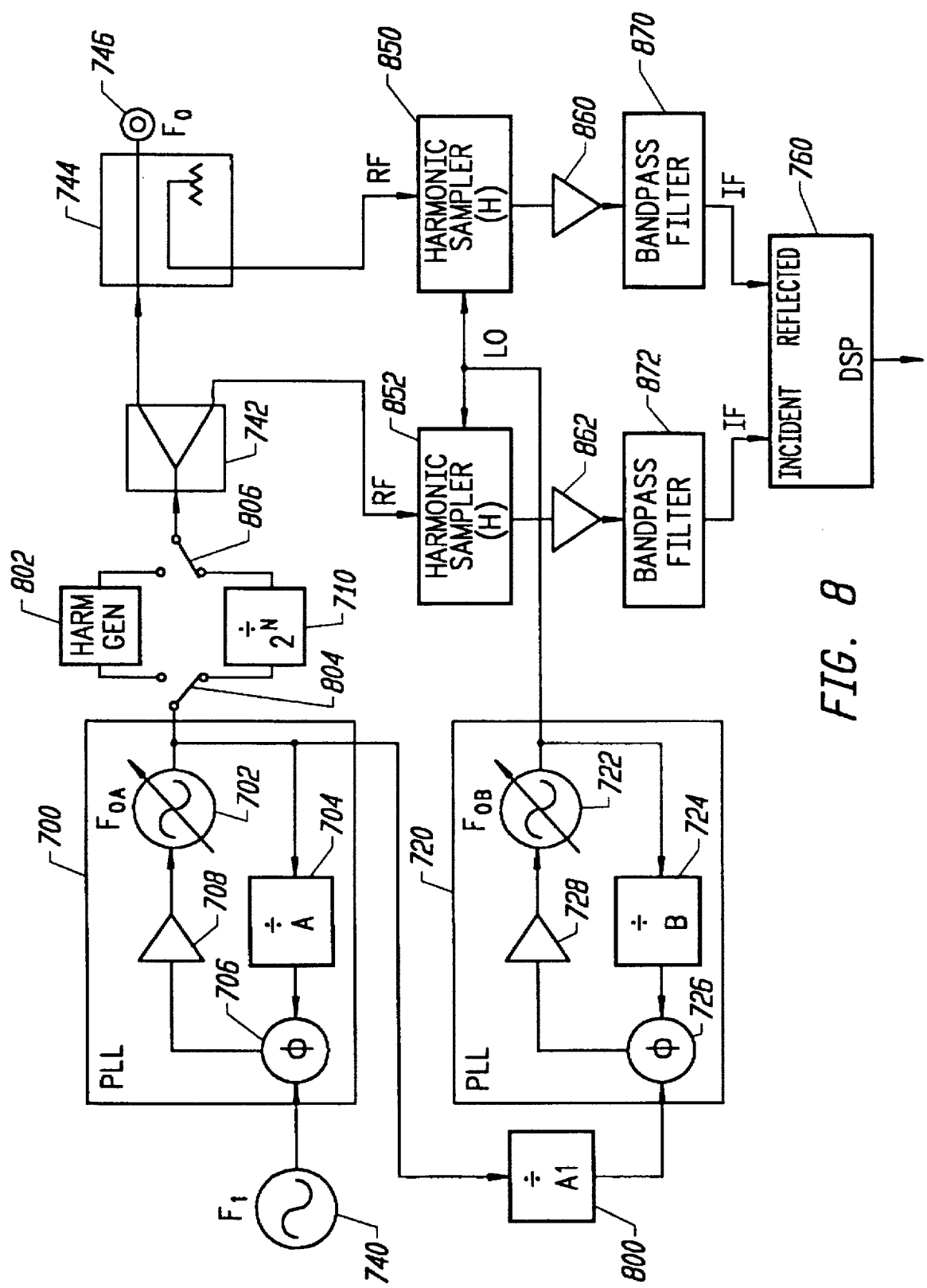
FIG. 8 shows a second embodiment of test circuitry of the present invention which modifies the circuitry of FIG. 7 to enable the tracking synthesizer to operate more independent of the test signal synthesizer.

FIG. 8 shows a second embodiment of test circuitry of the present invention which modifies the circuitry of FIG. 7 to enable the tracking synthesizer to operate more independent of the test signal synthesizer. Note that circuit components, such as splitter 742 and coupler 744 carried forward from FIG. 7 are similarly labeled in FIG. 8, as will be circuit components carried forward in subsequent figures.

The circuitry of FIG. 8 includes a test signal synthesizer or PLL 700 similar to that of FIG. 7. Synthesizer 700 includes an oscillator 702 having a frequency range labeled with a variable $F_{OA}$ to illustrate that oscillator 702 may operate at frequencies other than the 1.5–3 GHz range indicated in FIG. 7. As in FIG. 7, a reference oscillator 740 operating at a frequency $F_1$ is connected to one end of phase detector 706 in test signal synthesizer 700 in FIG. 8.

As in FIG. 7, the output of test signal synthesizer 700 can be connected to frequency divider 710. However, in FIG. 8, the output of test signal synthesizer 700 may also be connected to a harmonic generator 802. Harmonic generator 802 multiplies the frequency of the output signal from test signal synthesizer 700 enabling the maximum frequency of test signal synthesizer 700 to be reduced below the maximum frequency of the desired $F_O$ signal. The harmonic generator 802 and frequency divider 710 are optionally connected between the test signal synthesizer 700 and the splitter 742 using two newly added switches 804 and 806.

The circuitry of FIG. 8 further includes a tracking synthesizer or PLL 720, similar to FIG. 7. However, in FIG. 8 a first input of the phase detector 726 is connected to the output of a frequency divider 800 rather than to the output of oscillator 740 as in FIG. 7. The input of frequency divider 800 is connected to the output of oscillator 702. Also in contrast to FIG. 7, the output of tracking synthesizer 720 provides a LO signal directly to harmonic samplers 850 and 852.

The harmonic samplers 850 and 852 function similar to the mixers 750 and 752. A standard mixer has a frequency output $F_{IF}$ equal to $|F_{RF}-F_{LO}|$, whereas a harmonic sampler has a frequency output $F_{IF}$ equal to $|H \times F_{LO} - F_{RF}|$. A standard mixer can, thus, be formed by a harmonic sampler with H=1. Thus, like the mixers 750 and 752, the harmonic samplers 850 and 852 receive the RF signal from respective outputs of coupler 744 and splitter 742. The harmonic samplers 850 and 852 have outputs connected directly to DSP 760 through respective amplifiers 860 and 862 and bandpass filters 870 and 872. Use of the harmonic samplers 850 and 852 enables the frequency $F_{OB}$ to be reduced below the frequency $F_{OA}$ without use of a frequency divider such as 730 of FIG. 7.

In operation of the test circuitry of FIG. 8, a frequency $F_{OA}$ for oscillator 702 is selected, and if the frequency for $F_{OA}$ is outside the range of oscillator 702, the harmonic generator 802 or frequency divider 701 is appropriately connected and controlled to provide frequencies in the proper range. The frequency, $F_{OB}$, of oscillator 722 is then set to a multiple of $F_{OA}$±the desired IF frequency. Further, the value of B in frequency divider 724 is set to create an input to phase detector 726 equal to a multiple of the desired IF frequency. Finally, the value of A1 of frequency divider 800 is also set to provide an input to phase detector 726 equal to the output of frequency divider 724.

For example, assume the range of $F_{OA}$ is 1.5–3 GHz and that the desired frequency from $F_{OA}$ is 2.5 GHz. Frequency divider 710 will then be connected by switches 804 and 806 and the value of N for the frequency divider 710 will be set to 0. Further, assume that H in the harmonic samplers 850 and 852 is set to 1. With a desired IF frequency of 1 MHz, the value of $F_{OB}$ will be either 2.501 GHz or 2.499 GHz. Assuming $F_{OB}$ is 2.499 GHz, B will then be 2499. Similarly, A1 will be one greater than B, or 2500.

To make a tracking synthesizer 720 operate more independent of the test signal synthesizer 700, the input of phase detector 726 is connected to the output of oscillator 702 through frequency divider 800 rather than directly to reference oscillator 740 as in FIG. 7. In FIG. 7 whatever is done with the value of A must be similarly done with B. For instance in FIG. 7, with the frequency of $F_1$ being 1 Hz to create a step size of 1 Hz and with the value of $F_{OA}$ being 3 GHz, the value of A in frequency divider 704 would be 3,000,000,000 and the value of B would on the same order. With B on the order of 3 billion, the settling time of the circuit would be greater than 10 seconds. However, with the configuration of FIG. 8, with F1 equal to either 1 Hz or 1 MHz, the value of B does not have to change. Therefore, with the configuration of FIG. 8, the desired step size does not substantially effect the settling time of the circuit.

Although the value of B is unaffected by the desired step size, a value of B should be chosen to provide a reasonable settling time. To enable a reasonable settling time for the circuitry of FIG. 8, the outputs of frequency dividers 724 and 800 should at least produce a signal in the 100 KHz range.

Test Circuitry—Third Embodiment

Figure 9A:
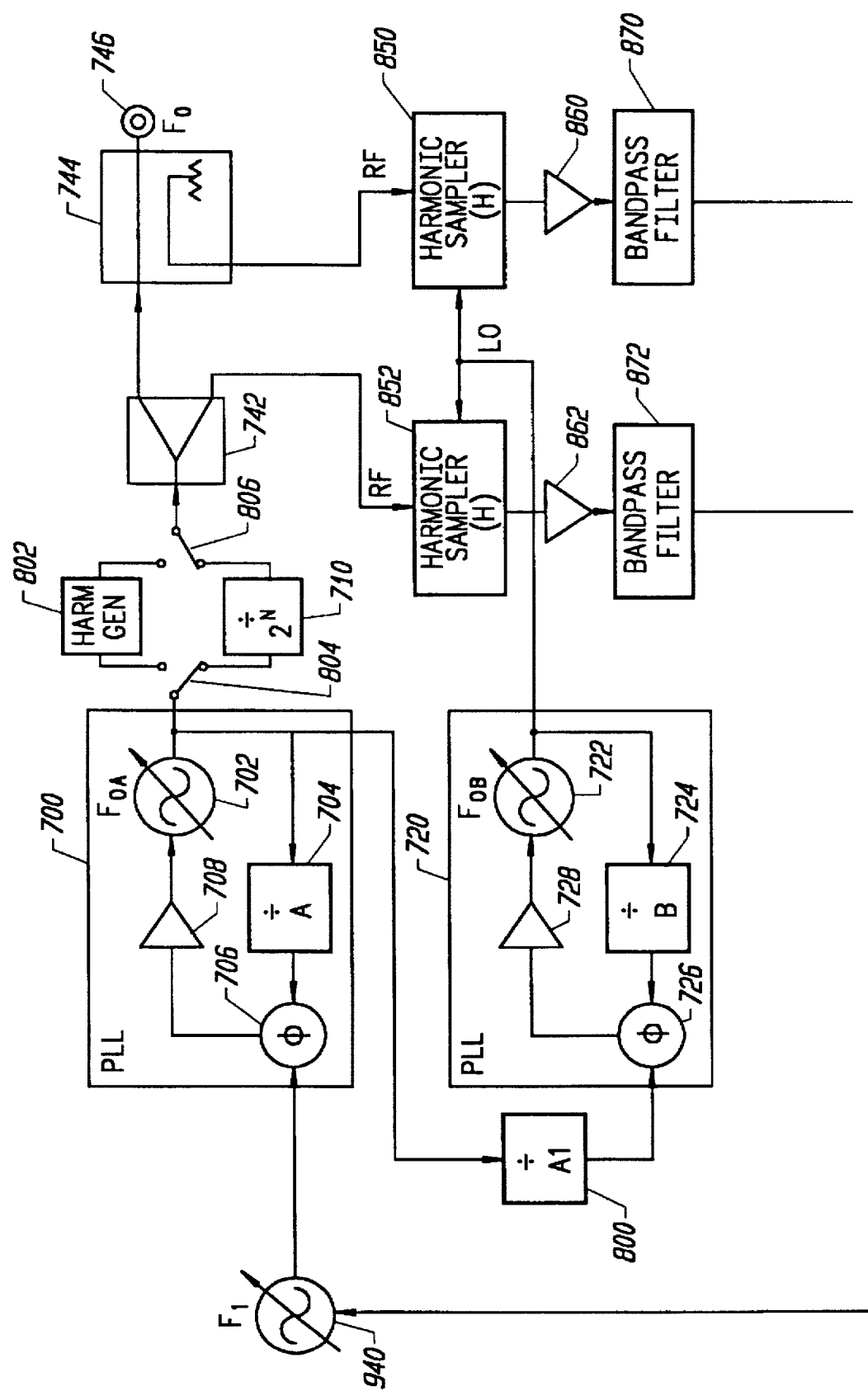
FIG. 9 shows a third embodiment of test circuitry of the present invention which modifies the circuitry of FIG. 8 by substituting the DSP with synchronous detectors of the present invention and further modifies FIG. 8 to enable the test circuitry to operate in the presence of other signals.
Figure 9B:
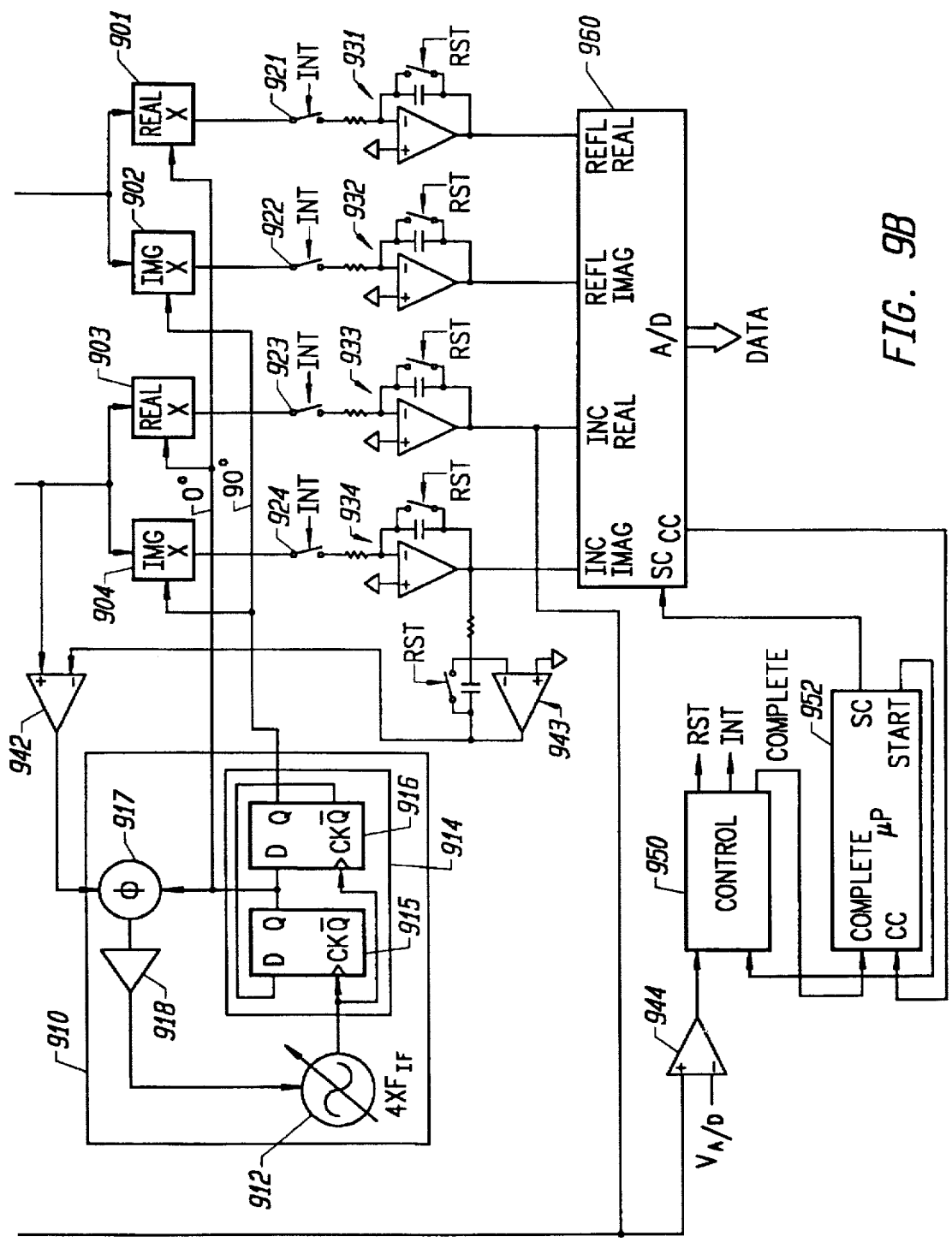

FIG. 9 shows a third embodiment of the test circuitry of the present invention which modifies the circuitry of FIG. 8 by substituting the DSP with synchronous detectors of the present invention and further modifies FIG. 8 to enable the test circuitry to operate in the presence of other signals.

As shown, the circuitry of FIG. 9 includes the test circuitry of FIG. 8 with the outputs of bandpass filters 870 and 872 connected to synchronous detector circuitry of the present invention rather than the DSP circuitry of FIG. 8. Note that although the synchronous detector circuitry of the present invention is shown replacing the DSP 760 of the circuitry of FIG. 8, it may also be used in place of the DSP in other circuitry such as that of FIG. 7.

In the synchronous detectors of the present invention, the IF output of bandpass filter 870 is received at a first input of multipliers 901 and 902, while the IF output of bandpass filter 872 is received at the first input of multipliers 903 and 904. A second input of multipliers 901 and 903 is connected to an output of a PLL 910 which provides a reference signal at the IF frequency phase shifted by 0 degrees. Multiplier 901, thus, outputs the reflected real component of the test signal while multiplier 903 outputs the incident real component of the test signal. A second input to multipliers 902 and 904 is connected to another output of PLL 910 which provides a reference signal at the IF frequency phase shifted by 90 degrees. Multiplier 902, thus, outputs the reflected imaginary component of the test signal while multiplier 904 outputs the incident imaginary real component of the test signal.

The outputs of multipliers 901–904 are connected through respective switches 921–924 and integrators 931–934 to A/D converter 960. The switches 921–924 are controlled to be opened or closed by an integrate signal (INT) received from control circuit 950. Further, control circuitry 950 provides a reset signal (RST) to a switch connected in parallel with the capacitors of integrators 931–934.

Synthesizer or PLL 910 includes an oscillator 912 operating at 4 times the IF frequency. The output of oscillator 912 is provided to a divide by 4 circuit 914 which provides a signal at the IF frequency with a phase shift of both 0 and 90 degrees.

The divide by four circuitry includes two D-type flip flops 915 and 916. Flip flops 915 and 916 have clock inputs receiving the output of oscillator 912. Further, the Q output of flip flop 915 is connected to the D input of flip flop 916, while the $\bar{Q}$ output of flip flop 916 is connected to the D input of flip flop 915. The Q output of flip flop 915, thus, provides a signal operating at the IF frequency phase shifted 0 degrees, while the Q output of flip flop 916 provides a signal operating at the IF frequency shifted by 90 degrees.

The 0 degree output of frequency divider 914 is provided to one input of phase detector 917, while a second input at the IF frequency is provided from comparator 942. Comparator 942 has a positive input connected to the output of bandpass filter 872 and a negative input connected through an integrator (or amplifier) 943 to the output of integrator 934 to assure the incident imaginary signal is held to a value of 0 V.

The comparator 942 holds the incident imaginary signal to 0 volts when measurements are taken because with any difference in phase between the signal from bandpass filter 872 and the 90 degree output of PLL 910, the output of integrator 934 will increase in voltage. With an offset in the voltage from integrator 934, integrator 943 amplifies the voltage to comparator 942 which will function to provide an output with a compensating phase shift to return the output of integrator 934 to zero volts.

Figure 10:
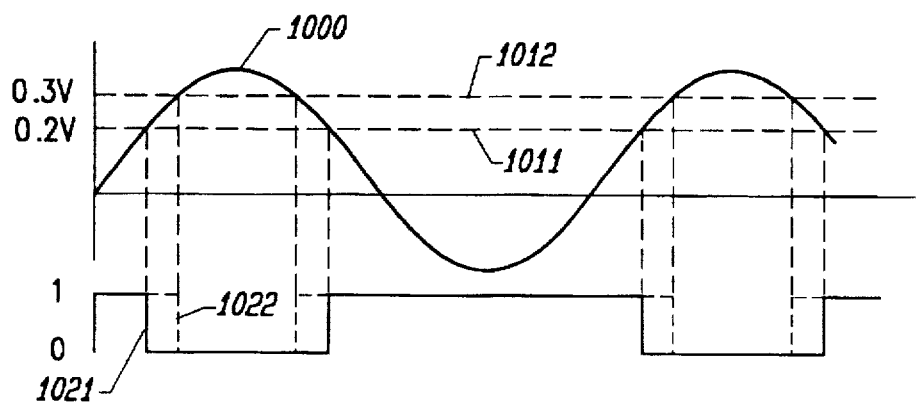
FIG. 10 shows signals received and produced by comparator 942 of FIG. 9.

Operation of comparator 942 is illustrated in FIG. 10. Signal 1000 illustrates an output of bandpass filter 872 received at the positive input of comparator 942. Signal 1011 represents a 0.2 V signal output from integrator 943, while signal 1012 illustrates a 0.3 V signal output from integrator 943. With signal 1011 output from integrator 934, comparator 942 outputs a signal 1021 shown with a solid line. Because signal 1000 has a sinusoidal shape, with an increase in voltage from integrator 934 which is amplified by integrator 943 to produce signal 1012, the output of comparator 942 produces a slightly shifted signal shown by dotted line 1022. Phase detector 917, will then detect the offset and provide appropriate voltage correction through amplifier and filter 918 to oscillator 912 to decrease the phase difference between the inputs to multiplier 904. The output of integrator 934 will, thus, be forced toward a value of 0 V.

To assure the full operation range of A/D converter 960 is utilized, the output of integrator 933 is provided to a positive input of a comparator 944. The negative input of comparator 944 is connected to a voltage reference supplying the maximum voltage of the A/D converter, $V_{A/D}$. The output of comparator 944 is supplied to control circuitry 950 which provides the RST, INT and a complete signal (COMPLETE). The COMPLETE signal is provided to a processor 952 along with a complete conversion (CC) from A/D converter 960. The processor provides a start signal (START) to control circuit 950 and a start conversion (SC) signal to the A/D converter 960.

Figure 11:
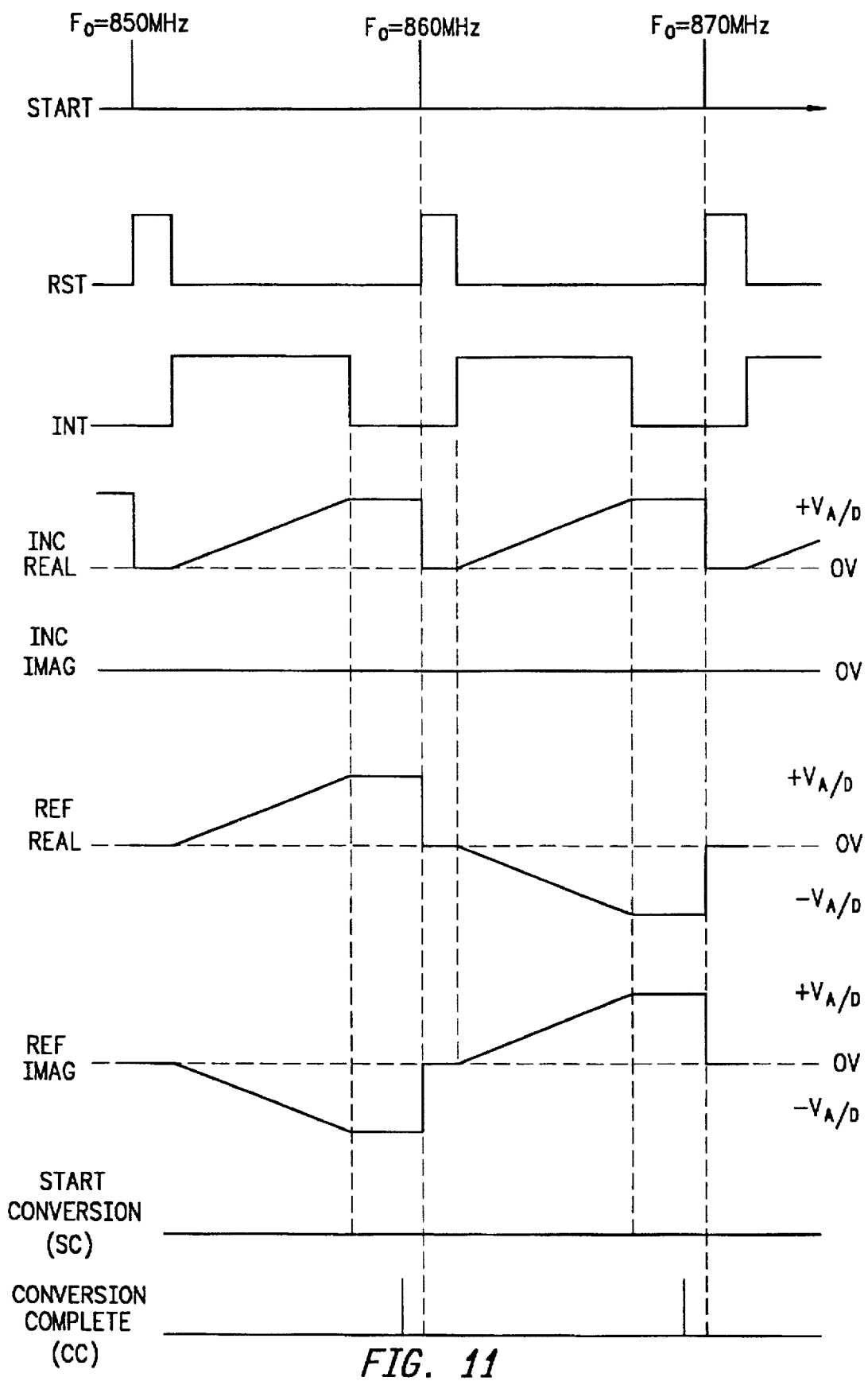
FIG. 11 shows signals received and produced by A/D converter 960, control circuit 950 and processor 952 of FIG. 9.

Operation of the A/D converter 960 is described with reference to the signals shown in FIG. 11. FIG. 11 shows three START signals generated from processor 952 for measurements with the $F_O$ signal generated at 850, 860 and 870 MHz. Upon receipt of each start signal, control circuit 950 generates a reset signal (RST) to discharge the capacitors of integrators 931–934 so the output of the integrators will have an initial value of 0 V. Further, on the trailing edge of each RST pulse, a integrate pulse (INT) is generated by control circuit 950, the INT signal closing switches 921–924 so that integrators 931–934 begin to function.

With the output of integrator 934 being provided to comparator 942 as described previously, the incident imaginary signal (INC IMAG) signal input to the A/D converter 960 is at 0 V. With INC IMAG set to 0 V, the incident real (INC REAL) signal will obtain its maximum value and will rise toward the maximum voltage $V_{A/D}$ of the A/D converter 960. Once $V_{A/D}$ is reached, comparator 944 provides a signal to control circuit 950 to turn off the INT signal, thus holding the outputs of integrators 931–934 at their current value. Further, the complete signal is sent to the microprocessor 952 which sends the start conversion signal (SC) to the A/D converter. Upon completion of conversion of its inputs to a digital data signal (DATA), the A/D converter 960 returns a conversion complete (CC) signal causing the processor to send the START signal back to control circuit 950 so that the next RST signal can be generated and another measurement cycle initiated.

Note that although the signals shown in FIG. 11 are described as being referenced to ground or 0 V, components may be referenced to other voltages than ground.

Note that although the INC IMAG signal is set to 0 V, a voltage offset may be applied to the positive input of integrators 931–934 so that the INC IMAG voltage value will be held by comparator 942 to the reference voltage value rather than 0 V.

The circuitry of FIG. 9 additionally includes a dither line connection from the output of integrator 933 to a voltage control input of a reference oscillator 940 to enable operation of the VNA of the present invention in the presence of external signals with reduced error over conventional VNAs. Reference oscillator 940 replaces the oscillator 740 of FIG. 8 and operates at a frequency $F_1$ which is a chosen reference frequency ±a 100 parts per million (ppm) offset. For example, if the desired reference frequency is 6 MHz, the ±100 ppm offset would be ±600 Hz. With the dither line connected to the output of integrator 933, the reference oscillator 940 will sweep the entire 100 ppm range during each measurement made by the A/D converter 960 due to the INC REAL signal always going from the 0 V reference to +$V_{A/D}$. Note that although a ±100 ppm range is suggested, different ranges may also be used.

Figure 12:
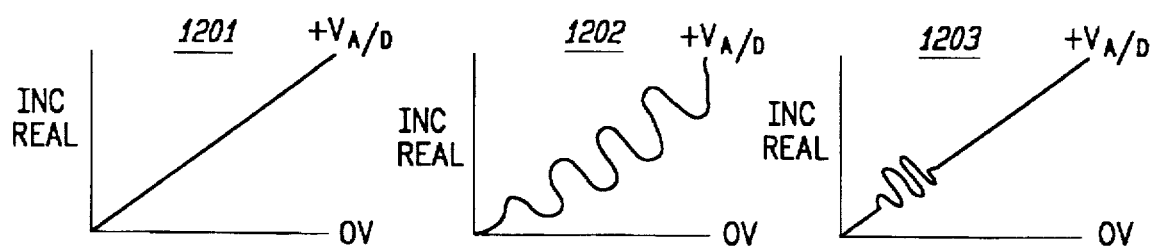
FIG. 12 illustrates operation of the test circuitry of FIG. 9 with and without the dither line connected.

FIG. 12 illustrates operation of the test circuitry of FIG. 9 with and without the dither line connected. Graph 1201 shows the INC REAL signal received without receipt of an additional external signal. Graph 1202 shows the INC REAL signal received in the presence of an external signal of frequency substantially equal to the reference frequency $F_t$ with the dither line disconnected. In graph 1202, interference of the signals occurs with error possibly occurring in the A/D measurement. Graph 1203 shows the INC REAL signal in the presence of the interfering signal with the dither line connected. As shown, with the dither line sweeping the frequency of reference oscillator 940, interference occurs only in a small range, substantially reducing the possibility of error.

Test Circuitry—Fourth Embodiment

Figure 13A:
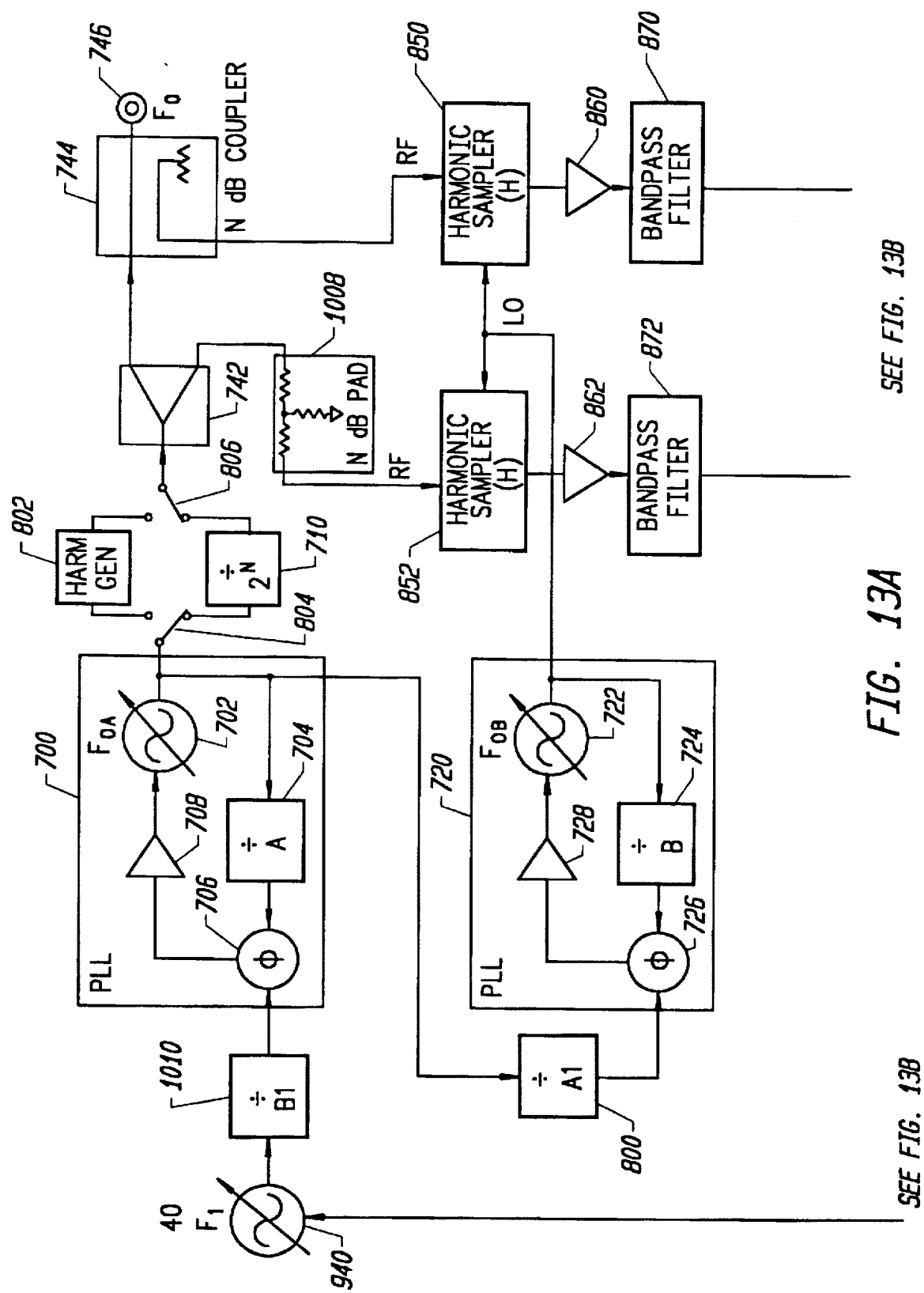
FIG. 13 shows modifications to the circuitry of FIG. 9 to provide a fourth embodiment of the present invention.
Figure 13B:
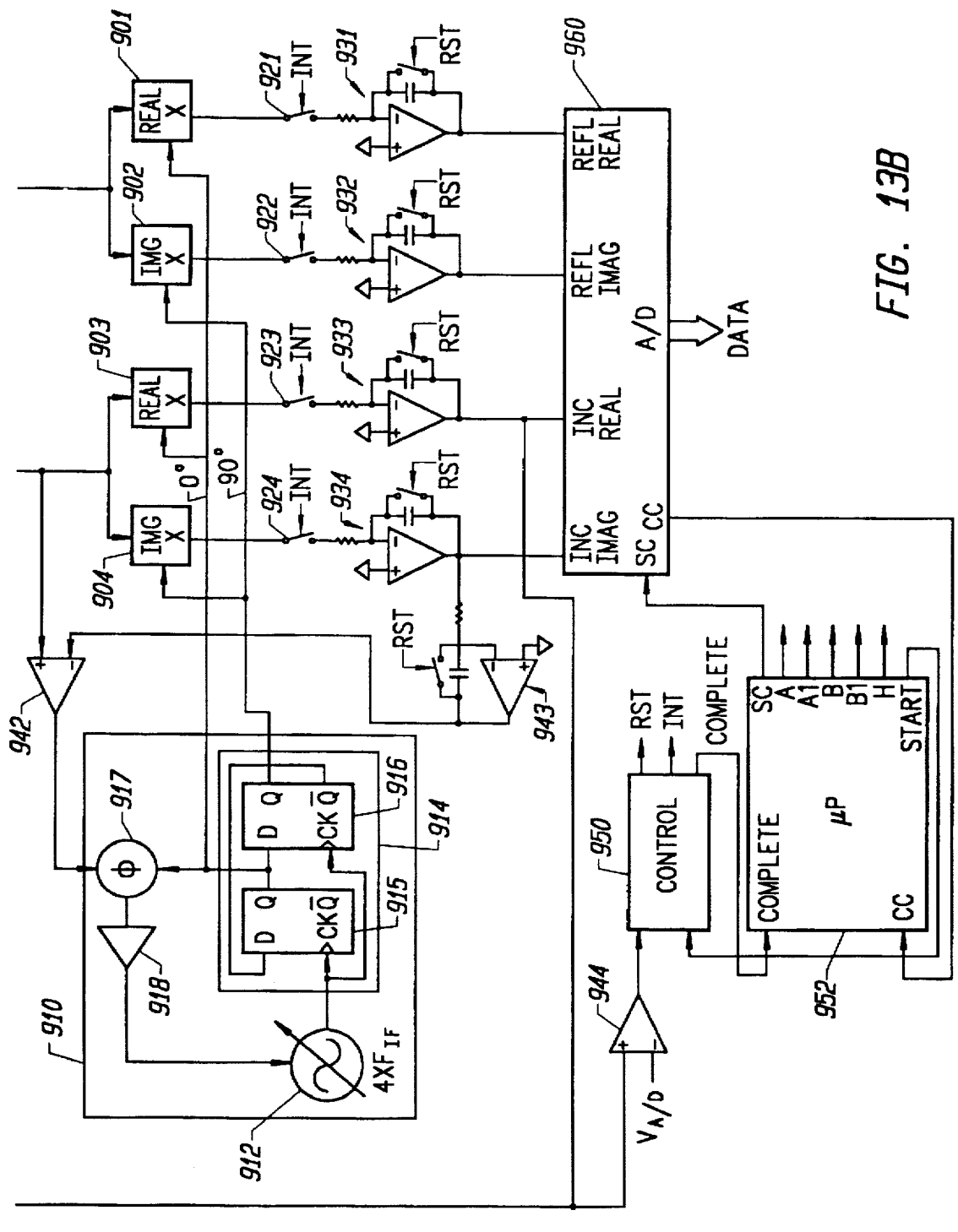

FIG. 13 shows modifications to the circuitry of FIG. 9 to provide a fourth embodiment of the present invention. The circuitry of FIG. 13 adds an N dB PAD 1008 to the circuitry of FIG. 9 between one output of splitter 742 and the input of harmonic sampler 852. The N dB PAD is chosen so that its dB value N matches the dB loss value N of coupler 744. Using the N dB PAD 1008 assures the incident signal received at harmonic sampler 852 has a magnitude on the same order as the reflected signal received at harmonic sampler 850 at the full reflection.

The circuitry of FIG. 13 additionally adds a frequency divider 1010 between the output of reference oscillator 940 and the input of phase detector 706. Frequency divider 1010 allows more flexibility in the frequency values available for reference oscillator 940.

Additionally, microprocessor 952 includes outputs H, A, A1, B and B1 which are respectively provided to harmonic samplers 850 and 852, and frequency dividers 704, 800, 724 and 1010 to interactively control their values.

Appendix A includes a sample basic program, similar to a program utilized by processor 952 to calculates values for the frequency dividers and other components. The program of Appendix A includes values for $F_O$, M, $F_{OA}$, $F_{OB}$ IF, H, $F_1$, A, B1, B and A1. The program of Appendix A assumes $F_{OA}$ goes between 550 to 1100 MHz to produce an output $F_O$ from 25 MHz to 3.3 GHz as shown by the sample run of the program also included in Appendix A. Further, the program assumes $F_{OB}$ ranges from approximately 25–50 MHz. Additionally, values of M, which represent the multiple between $F_{OA}$ and $F_O$, are utilized which range from 1/32 to 3 provide the necessary range of output frequencies $F_O$. Note that the values of M are utilized to control switches 804 and 806 to connect to either the harmonic generator 802 or frequency divider 710. The multiple M is also used to determine which frequency multiple output from either frequency divider 710 or harmonic generator 802 is required.

CONCLUSION

Although the invention has been described above with particularity, this was merely to teach one of ordinary skill in the art how to make and use the invention. Many modifications will fall within the scope of the invention, as that scope is defined by the following claims.

- 27 -

APPENDIX A

```
10 REM ! ANTPAT ! DAB 12/18/94 ! FREQUENCY & "N"
PRINTOUTS FOR PORTABLE VNA !
20 CLS :KEY OFF :CNT=0 :F=25
30 PRINT "                          PRINTING"
40 M=1/32 :M$"1/32" :R1=40 :R2=4
50 IF F>=2200 THEN M=3 :M$="3" :R1=30 :R2=12 :GOTO 120
60 IF F>=1100 THEN M=2 :M$=" 2 " :R2=8 :GOTO 120
70 IF F>=550 THEN M=1 :M$=" 1 " :GOTO 120
80 IF F>=275 THEN M=1/2 : M$=" 1/2": R2=12 GOTO 120
90 IF F>=137.5 THEN M=1/4 :M$=" 1/4" :R2=8 :GOTO 120
100 IF F>=68.75 THEN M=1/8 :M$=" 1/8" :GOTO 120
110 IF F>=34.375 THEN M=1/16 :M$="1/16" :R2=8
120 N1=INT(R1*F/M+.5)
130 H=1+INT(((M*N1/R1)-.1953125)/50)
140 IF M>1 THEN 190
150 IF M=1 THEN 200
160 IF M=1/2 THEN 220
170 IF M>1/16 THEN 240
180 GOTO 260
190 IF H MOD M=0 THEN H=H+1
200 N2=1+256*H
210 GOTO 270
220 N2=INT(.5+1536*(F*H)/(F-.1953125))
230 GOTO 270
240 N2=INT(.5+2048*(F*H)/(F-.1953125))
250 GOTO 270
260 N2=INT(.5+8192*(F*H)/(F-.1953125))
270 IF CNT>0 THEN 300
280 LPRINT "Fo   M   FoA   FoB   IF   H   F1   A   B1   B   A1"
290 LPRINT "------------------------------------------------"
300 LPRINT USING "####.##   ";M*N1/R1;
310 LPRINT M$;
320 LPRINT USING "  ####.##";N1/R1;
330 LPRINT USING "    ##.###";(N1*R2*64)/(R1*N2);
340 LPRINT USING ".####";ABS((M*N1/R1)-
(H*N1*R2*64)/(R1*N2));
350 LPRINT USING "   ##";H;
360 LPRINT "     6";
370 LPRINT USING "    #####";N1;
380 LPRINT USING "   ###";6*R1;
390 LPRINT USING "   ###";64*R2;
400 LPRINT USING "   #####";N2
410 CNT=CNT+1
420 IF CNT>50 THEN LPRINT CHR$(12) :CNT=0
430 IF F=3300 THEN 470
440 F=1.05*F
450 IF F>3300 THEN F=3300
460 GOTO 40
470 END
```

- 28 -

| | Fo | M | FoA | FoB | IF | H | F1 | A | B1 | B | A1 |
|---|---|---|---|---|---|---|---|---|---|---|---|
| | 25.00 | 1/32 | 800.00 | 24.803 | .1968 | 1 | 6 | 32000 | 240 | 256 | 8257 |
| | 26.25 | 1/32 | 840.00 | 26.056 | .1940 | 1 | 6 | 33600 | 240 | 256 | 8253 |
| | 27.56 | 1/32 | 882.00 | 27.369 | .1938 | 1 | 6 | 35280 | 240 | 256 | 8250 |
| 5 | 28.94 | 1/32 | 926.10 | 28.744 | .1965 | 1 | 6 | 37044 | 240 | 256 | 8248 |
| | 30.39 | 1/32 | 972.40 | 30.192 | .1953 | 1 | 6 | 38896 | 240 | 256 | 8245 |
| | 31.91 | 1/32 | 1021.03 | 31.713 | .1936 | 1 | 6 | 40841 | 240 | 256 | 8242 |
| | 33.50 | 1/32 | 1072.08 | 33.307 | .1952 | 1 | 6 | 42883 | 240 | 256 | 8240 |
| | 35.18 | 1/16 | 562.85 | 34.982 | .1964 | 1 | 6 | 22514 | 240 | 512 | 8238 |
| 10 | 36.94 | 1/16 | 590.98 | 36.739 | .1973 | 1 | 6 | 23639 | 240 | 512 | 8236 |
| | 38.78 | 1/16 | 620.53 | 38.590 | .1931 | 1 | 6 | 24821 | 240 | 512 | 8233 |
| | 40.72 | 1/16 | 651.55 | 40.529 | .1929 | 1 | 6 | 26062 | 240 | 512 | 8231 |
| | 42.76 | 1/16 | 684.13 | 42.560 | .1974 | 1 | 6 | 27365 | 240 | 512 | 8230 |
| | 44.90 | 1/16 | 718.35 | 44.700 | .1964 | 1 | 6 | 28734 | 240 | 512 | 8228 |
| 15 | 47.14 | 1/16 | 754.25 | 46.946 | .1948 | 1 | 6 | 30170 | 240 | 512 | 8226 |
| | 49.50 | 1/16 | 791.98 | 49.306 | .1926 | 1 | 6 | 31679 | 240 | 512 | 8224 |
| | 51.97 | 1/16 | 831.58 | 25.889 | .1959 | 2 | 6 | 33263 | 240 | 512 | 16446 |
| | 54.57 | 1/16 | 873.15 | 27.188 | .1958 | 2 | 6 | 34926 | 240 | 512 | 16443 |
| | 57.30 | 1/16 | 916.80 | 28.552 | .1952 | 2 | 6 | 36672 | 240 | 512 | 16440 |
| 20 | 60.17 | 1/16 | 962.65 | 29.986 | .1940 | 2 | 6 | 38506 | 240 | 512 | 16437 |
| | 63.17 | 1/16 | 1010.78 | 31.489 | .1960 | 2 | 6 | 40431 | 240 | 512 | 16435 |
| | 66.33 | 1/16 | 1061.33 | 33.070 | .1938 | 2 | 6 | 42453 | 240 | 512 | 16432 |
| | 69.65 | 1/8 | 557.20 | 34.723 | .2035 | 2 | 6 | 22288 | 240 | 256 | 4108 |
| | 73.13 | 1/8 | 585.05 | 36.468 | .1959 | 2 | 6 | 23402 | 240 | 256 | 4107 |
| 25 | 76.79 | 1/8 | 614.30 | 38.300 | .1870 | 2 | 6 | 24572 | 240 | 256 | 4106 |
| | 80.63 | 1/8 | 645.03 | 40.216 | .1964 | 2 | 6 | 25801 | 240 | 256 | 4106 |
| | 84.66 | 1/8 | 677.28 | 42.237 | .1856 | 2 | 6 | 27091 | 240 | 256 | 4105 |
| | 88.89 | 1/8 | 711.13 | 44.348 | .1949 | 2 | 6 | 28445 | 240 | 256 | 4105 |
| | 93.34 | 1/8 | 746.70 | 46.566 | .2046 | 2 | 6 | 29868 | 240 | 256 | 4105 |
| 30 | 98.00 | 1/8 | 784.03 | 48.906 | .1910 | 2 | 6 | 31361 | 240 | 256 | 4104 |
| | 102.90 | 1/8 | 823.23 | 34.234 | .2006 | 3 | 6 | 32929 | 240 | 256 | 6156 |
| | 108.05 | 1/8 | 864.38 | 35.951 | .1931 | 3 | 6 | 34575 | 240 | 256 | 6155 |
| | 113.45 | 1/8 | 907.60 | 37.749 | .2028 | 3 | 6 | 36304 | 240 | 256 | 6155 |
| | 119.12 | 1/8 | 952.98 | 39.643 | .1936 | 3 | 6 | 38119 | 240 | 256 | 6154 |

- 29 -

| | Fo | M | FoA | FoB | IF | H | F1 | A | B1 | B | A1 |
|---|---|---|---|---|---|---|---|---|---|---|---|
| | 125.08 | 1/8 | 1000.63 | 41.625 | .2032 | 3 | 6 | 40025 | 240 | 256 | 6154 |
| | 131.33 | 1/8 | 1050.68 | 43.714 | .1921 | 3 | 6 | 42027 | 240 | 256 | 6153 |
| | 137.90 | 1/4 | 551.60 | 45.899 | .2017 | 3 | 6 | 22064 | 240 | 512 | 6153 |
| | 144.79 | 1/4 | 579.18 | 48.202 | .1883 | 3 | 6 | 23167 | 240 | 512 | 6152 |
| 5 | 152.04 | 1/4 | 608.15 | 37.958 | .2039 | 4 | 6 | 24326 | 240 | 512 | 8203 |
| | 159.64 | 1/4 | 638.55 | 39.861 | .1946 | 4 | 6 | 25542 | 240 | 512 | 8202 |
| | 167.62 | 1/4 | 670.48 | 41.854 | .2044 | 4 | 6 | 26819 | 240 | 512 | 8202 |
| | 176.00 | 1/4 | 704.00 | 43.952 | .1931 | 4 | 6 | 28160 | 240 | 512 | 8201 |
| | 184.80 | 1/4 | 739.20 | 46.149 | .2028 | 4 | 6 | 29568 | 240 | 512 | 8201 |
| 10 | 194.04 | 1/4 | 776.15 | 48.462 | .1893 | 4 | 6 | 31046 | 240 | 512 | 8200 |
| | 203.74 | 1/4 | 814.98 | 40.709 | .1988 | 5 | 6 | 32599 | 240 | 512 | 10250 |
| | 213.93 | 1/4 | 855.73 | 42.749 | .1879 | 5 | 6 | 34229 | 240 | 512 | 10249 |
| | 224.63 | 1/4 | 898.50 | 44.886 | .1973 | 5 | 6 | 35940 | 240 | 512 | 10249 |
| | 235.86 | 1/4 | 943.43 | 47.134 | .1841 | 5 | 6 | 37737 | 240 | 512 | 10248 |
| 15 | 247.65 | 1/4 | 990.60 | 49.491 | .1933 | 5 | 6 | 39624 | 240 | 512 | 10248 |
| | 260.03 | 1/4 | 1040.13 | 43.307 | .1903 | 6 | 6 | 41605 | 240 | 512 | 12297 |
| | 273.03 | 1/4 | 1092.13 | 45.472 | .1998 | 6 | 6 | 43685 | 240 | 512 | 12297 |
| | 286.69 | 1/2 | 573.38 | 47.750 | .1865 | 6 | 6 | 22935 | 240 | 768 | 9222 |
| | 301.01 | 1/2 | 602.03 | 42.974 | .1959 | 7 | 6 | 24081 | 240 | 768 | 10759 |
| 20 | 316.08 | 1/2 | 632.15 | 45.124 | .2057 | 7 | 6 | 25286 | 240 | 768 | 10759 |
| | 331.88 | 1/2 | 663.75 | 47.384 | .1851 | 7 | 6 | 26550 | 240 | 768 | 10758 |
| | 348.46 | 1/2 | 696.93 | 49.753 | .1943 | 7 | 6 | 27877 | 240 | 768 | 10758 |
| | 365.89 | 1/2 | 731.78 | 45.710 | .2083 | 8 | 6 | 29271 | 240 | 768 | 12295 |
| | 384.19 | 1/2 | 768.38 | 48.000 | .1875 | 8 | 6 | 30735 | 240 | 768 | 12294 |
| 25 | 403.39 | 1/2 | 806.78 | 44.798 | .2042 | 9 | 6 | 32271 | 240 | 768 | 13831 |
| | 423.56 | 1/2 | 847.13 | 47.042 | .1837 | 9 | 6 | 33885 | 240 | 768 | 13830 |
| | 444.74 | 1/2 | 889.48 | 49.394 | .1929 | 9 | 6 | 35579 | 240 | 768 | 13830 |
| | 466.98 | 1/2 | 933.95 | 46.679 | .1823 | 10 | 6 | 37358 | 240 | 768 | 15366 |
| | 490.33 | 1/2 | 980.65 | 49.013 | .1915 | 10 | 6 | 39226 | 240 | 768 | 15366 |
| 30 | 514.84 | 1/2 | 1029.68 | 46.787 | .1828 | 11 | 6 | 41187 | 240 | 768 | 16902 |
| | 540.59 | 1/2 | 1081.18 | 49.127 | .1920 | 11 | 6 | 43247 | 240 | 768 | 16902 |
| | 567.63 | 1 | 567.63 | 47.287 | .1847 | 12 | 6 | 22705 | 240 | 256 | 3073 |
| | 596.00 | 1 | 596.00 | 49.651 | .1940 | 12 | 6 | 23840 | 240 | 256 | 3073 |

- 30 -

| Fo | M | FoA | FoB | IF | H | Fl | A | B1 | B | A1 |
|---|---|---|---|---|---|---|---|---|---|---|
| 625.80 | 1 | 625.80 | 48.124 | .1880 | 13 | 6 | 25032 | 240 | 256 | 3329 |
| 657.08 | 1 | 657.08 | 46.921 | .1833 | 14 | 6 | 26283 | 240 | 256 | 3585 |
| 689.95 | 1 | 689.95 | 49.268 | .1924 | 14 | 6 | 27598 | 240 | 256 | 3585 |
| 724.43 | 1 | 724.43 | 48.282 | .1886 | 15 | 6 | 28977 | 240 | 256 | 3841 |
| 760.65 | 1 | 760.65 | 47.529 | .1857 | 16 | 6 | 30426 | 240 | 256 | 4097 |
| 798.70 | 1 | 798.70 | 49.907 | .1949 | 16 | 6 | 31948 | 240 | 256 | 4097 |
| 838.63 | 1 | 838.63 | 49.320 | .1926 | 17 | 6 | 33545 | 240 | 256 | 4353 |
| 880.55 | 1 | 880.55 | 48.909 | .1910 | 18 | 6 | 35222 | 240 | 256 | 4609 |
| 924.58 | 1 | 924.58 | 48.652 | .1901 | 19 | 6 | 36983 | 240 | 256 | 4865 |
| 970.83 | 1 | 970.83 | 48.532 | .1896 | 20 | 6 | 38833 | 240 | 256 | 5121 |
| 1019.35 | 1 | 1019.35 | 48.531 | .1896 | 21 | 6 | 40774 | 240 | 256 | 5377 |
| 1070.33 | 1 | 1070.33 | 48.643 | .1899 | 22 | 6 | 42813 | 240 | 256 | 5633 |
| 1123.85 | 2 | 561.93 | 48.855 | .1908 | 23 | 6 | 22477 | 240 | 512 | 5889 |
| 1180.05 | 2 | 590.03 | 47.195 | .1844 | 25 | 6 | 23601 | 240 | 512 | 6401 |
| 1239.05 | 2 | 619.53 | 49.554 | .1936 | 25 | 6 | 24781 | 240 | 512 | 6401 |
| 1301.00 | 2 | 650.50 | 48.178 | .1882 | 27 | 6 | 26020 | 240 | 512 | 6913 |
| 1366.05 | 2 | 683.03 | 47.099 | .1841 | 29 | 6 | 27321 | 240 | 512 | 7425 |
| 1434.35 | 2 | 717.18 | 49.454 | .1931 | 29 | 6 | 28687 | 240 | 512 | 7425 |
| 1506.05 | 2 | 753.03 | 48.576 | .1898 | 31 | 6 | 30121 | 241 | 512 | 7937 |
| 1581.35 | 2 | 790.68 | 47.914 | .1871 | 33 | 6 | 31627 | 240 | 512 | 8449 |
| 1660.40 | 2 | 830.20 | 47.435 | .1853 | 35 | 6 | 33208 | 240 | 512 | 8961 |
| 1743.45 | 2 | 871.73 | 49.807 | .1945 | 35 | 6 | 34869 | 240 | 512 | 8961 |
| 1830.60 | 2 | 915.30 | 49.470 | .1932 | 37 | 6 | 36612 | 240 | 512 | 9473 |
| 1922.15 | 2 | 961.08 | 49.281 | .1925 | 39 | 6 | 38443 | 240 | 512 | 9985 |
| 2018.25 | 2 | 1009.13 | 49.221 | .1923 | 41 | 6 | 40365 | 240 | 512 | 10497 |
| 2119.15 | 2 | 1059.58 | 49.278 | .1924 | 43 | 6 | 42383 | 240 | 512 | 11009 |
| 2225.10 | 2 | 741.70 | 48.368 | .1890 | 46 | 6 | 22251 | 180 | 768 | 11777 |
| 2336.40 | 3 | 778.80 | 49.707 | .1941 | 47 | 6 | 23364 | 180 | 768 | 12033 |
| 2453.20 | 3 | 817.73 | 49.060 | .1917 | 50 | 6 | 24532 | 180 | 768 | 12801 |
| 2575.90 | 3 | 858.63 | 49.533 | .1934 | 52 | 6 | 25759 | 180 | 768 | 13313 |
| 2704.60 | 3 | 901.53 | 49.171 | .1921 | 55 | 6 | 27046 | 180 | 768 | 14081 |
| 2839.90 | 3 | 946.63 | 48.960 | .1912 | 58 | 6 | 28399 | 180 | 768 | 14849 |
| 2981.90 | 3 | 993.97 | 48.880 | .1909 | 61 | 6 | 29819 | 180 | 768 | 15617 |

Attorney Docket No.: WILT7674MCF/TAW
TAW/WILT/7674.001

94/12/22-15:21

- 31 -

| Fo | M | FoA | FoB | IF | H | Fl | A | B1 | B | A1 |
|---|---|---|---|---|---|---|---|---|---|---|
| 3131.00 | 3 | 1043.67 | 48.919 | .1912 | 64 | 6 | 31310 | 180 | 768 | 16385 |
| 3287.50 | 3 | 1095.83 | 49.064 | .1917 | 67 | 6 | 32875 | 180 | 768 | 17153 |
| 3300.00 | 3 | 1100.00 | 49.251 | .1924 | 67 | 6 | 33000 | 180 | 768 | 17153 |

What is claimed is:

1. A vector network analyzer (VNA) comprising:
   a test signal synthesizer;
   a tracking synthesizer;
   a first frequency divider positioned to couple an output of the test signal synthesizer to a test port;
   a first mixing means having a first input coupled to receive an output of the first frequency divider, a second input coupled to an output of the tracking synthesizer, and an output providing an incident IF signal; and
   a second mixing means having a first input coupled to receive a signal from the test port, a second input coupled to receive an output of the tracking synthesizer, and an output providing a reflected IF signal.

2. The VNA of claim 1 further comprising:
   a harmonic generator positioned to couple the output of the test signal synthesizer to the test port.

3. The VNA of claim 1, wherein maximum dimensions of the VNA are 6 inches×8 inches×2.5 inches when the test port is capable of providing a 3.3 GHz signal.

4. The VNA of claim 1 wherein a maximum weight of the VNA is three pounds including batteries when the test port is capable of providing a 3.3 GHz signal.

5. The VNA of claim 1, wherein the first and second mixing means comprise harmonic samplers.

6. The VNA of claim 1 further comprising:
   a second frequency divider coupling the output of the tracking synthesizer to the second input of the first mixing means and to the second input of the second mixing means.

7. The VNA of claim 1, wherein the first frequency divider divides the output of a signal from the output of the test signal synthesizer by a number N and wherein a frequency of a signal from the output of the tracking synthesizer is controlled to be equal to the frequency of the output of the test signal synthesizer plus N times a frequency of the incident IF signal.

8. The VNA of claim 1 further comprising:
   a reference oscillator for providing an output signal having a reference frequency with a varied offset to a phase detector input of the test signal synthesizer, the varied offset being varied as controlled by a voltage control input to the reference oscillator; and
   a dither means coupled for receiving the incident IF signal and providing a voltage control signal changing from a minimum value to a maximum value during a cycle of the incident IF signal to the voltage control input of the reference oscillator.

9. The VNA of claim 1, further comprising:
   an analog to digital (A/D) converter;
   a first synchronous detector including a series connected multiplier and integrator, the multiplier having a first input receiving the incident IF signal, and a second input, and the integrator having an output providing an incident real voltage signal to an input of the A/D converter;
   a second synchronous detector including a series connected multiplier and integrator, the multiplier of the second synchronous detector having a first input receiving the incident IF signal, and a second input, and the integrator of the second synchronous detector having an output providing an incident imaginary voltage signal to an input of the A/D converter;
   a third synchronous detector including a series connected multiplier and integrator, the multiplier of the third synchronous detector having a first input receiving the reflected IF signal, and a second input, and the integrator of the third synchronous detector having an output providing a reflected real voltage signal to an input of the A/D converter;
   a fourth synchronous detector including a series connected multiplier and integrator, the multiplier of the fourth synchronous detector having a first input receiving the reflected IF signal, and a second input, and the integrator of the fourth synchronous detector having an output providing a reflected imaginary voltage signal to an input of the A/D converter; and
   a synchronous detector control means coupled for receiving the incident IF signal and providing a first phase reference output to the second input of the multipliers of the first and third synchronous detectors, and a second phase reference output with approximately a 90 degree phase difference from the first phase reference output to the second input of the multipliers of the second and fourth synchronous detectors.

10. The VNA of claim 9, wherein the synchronous detector control means is further coupled for receiving the incident imaginary voltage from the output of the integrator of the second synchronous detector and providing the first and second phase reference outputs so that the incident imaginary voltage signal does not change substantially over time.

11. The VNA of claim 9, wherein the A/D converter operates to accurately convert an input signal up to a maximum voltage, the VNA further comprising:
   an A/D converter range maximizing means having a first input receiving a voltage reference approximately equal to the maximum voltage, a second input connected to the output of the integrator of the first synchronous detector, end an output providing an integrate signal at a beginning of a cycle of the incident IF signal and a reset signal when the incident real voltage reaches the maximum value, and
   wherein the first, second, third and fourth synchronous detectors each further comprise:
   a first switch coupled for receiving the integrate signal from the A/D converter range maximizing means and for coupling the output of the multiplier of a respective one of the synchronous detectors to the input of the integrator of the respective one of the synchronous detectors, the first switch being controlled to close when the integrate signal is enabled and to open when the integrate signal is disabled; and
   a second switch coupled for receiving the reset signal from the A/D converter range maximizing means and for coupling the input to the output of the integrator of the respective one of the synchronous detectors, the second switch being controlled to close when the reset signal is enabled and to open when the reset signal is disabled.

12. The VNA of claim 1, wherein the tracking synthesizer and the test signal synthesizer have phase detector inputs, and wherein the test signal synthesizer and the tracking synthesizer each comprise:
   an oscillator having a voltage control input and an output for providing the respective synthesizer output;
   a phase detector having first and second inputs and providing a voltage control signal output coupled to the voltage control input of the oscillator, the first phase detector input providing the phase detector input of the respective synthesizer; and
   a synthesizer frequency divider for connecting the output of the oscillator to the second input of the phase detector.

13. The VNA of claim 1; wherein the first frequency divider has an input connected to the output of the test signal synthesizer, and an output, the VNA further comprising:

a splitter having an input coupled to the first frequency divider output, a first output connected to the first input of the first mixing means and a second output; and a coupler having a thru path connected from the second output of the splitter to the test port and a coupling path coupling the test port to the first input of the second mixing means.

14. The VNA of claim 1, wherein the VNA is handheld.

15. A vector network analyzer (VNA) comprising:

a test signal synthesizer including a series coupled phase detector, oscillator and synthesizer frequency divide;

a tracking synthesizer including a series coupled phase detector, oscillator and synthesizer frequency divider;

a first frequency divider coupling an output of the test signal synthesizer to a test port; and a second frequency divider for connecting an output of the test signal synthesizer to an input of the phase detector of the tracking synthesizer.

16. The VNA of claim 15 further comprising:

a first mixing means having a first input coupled to receive an output of the first frequency divider a second input coupled to an output of the tracking synthesizer, and an output providing an incident IF signal; and a second mixing means having a first input coupled to receive a signal from the test port, a second input coupled to receive the output of the tracking synthesizer, and an output providing a reflected IF signal.

17. The VNA of claim 16, further comprising:

a splitter having an input coupled to the first frequency divider output, a first output connected to the first input of the first mixing means and a second output; and a coupler having a thru path connected from the second output of the splitter to the test port and a coupling path coupling the test port to the first input of the second mixing means.

18. The VNA of claim 16 wherein the first and second mixing means comprise harmonic samplers.

19. A vector network analyzer (VNA) comprising:

a test signal synthesizer having an output coupled to a test port;

a tracking synthesizer:

a mixing means having a first input coupled to receive an output of the test signal synthesizer, a second input coupled to an output of the tracking synthesizer, and an output providing an incident IF signal;

a reference oscillator for providing an output signal having a reference frequency with a varied offset to a phase detector input of the test signal synthesizer, the varied offset being varied as controlled by a voltage control input to the reference oscillator; and a dither means coupled for receiving the incident IF signal and providing a voltage control signal changing from a minimum value to a maximum value during a cycle of the incident IF signal to the voltage control input of the reference oscillator.

20. The VNA of claim 19 wherein the dither means comprises:

an IQ detection synthesizer for providing a first phase reference output and a second phase reference output approximately 90 degrees out of phase with the first phase reference output, the first phase reference output being provided to a first phase detector input of the IQ detection synthesizer;

a first multiplier coupled for receiving the incident IF signal and the first phase reference output and providing an incident real output signal;

a second multiplier coupled for receiving the incident IF signal and the second phase reference output and providing an incident imaginary output signal;

a first integrator coupled for receiving the incident real output signal and having an output providing the voltage control input of the reference oscillator;

a second integrator coupled for receiving the incident imaginary output signal and having an output; and a comparator having a first input coupled by an integrator to an output of the second integrator, a second input receiving the incident IF signal and an output connected to a second phase detector input of the IQ detection synthesizer.

21. The VNA of claim 20 wherein the IQ detection synthesizer comprises:

an oscillator having a voltage control input and an output for providing an output signal with a frequency approximately four times a frequency of the incident IF signal based on a signal received at its voltage control input;

a phase detector having a first input providing the first phase detector input and a second input providing the second phase detector input, the phase detector providing a voltage control signal coupled to the voltage control input of the oscillator based upon a phase comparison of signals at its first and second inputs;

a first D-type flip-flop having a clock input receiving the oscillator output, a Q output providing the first phase reference output, and having a D input; and a second D-type flip-flop having a clock input receiving the oscillator output, a D input receiving the Q output of the first D-type flip-flop, a Q output connected to the D input of the first D-type flip-flop and a Q output providing the second phase reference output.

22. The VNA of claim 19 wherein the mixing means comprises a harmonic sampler.

23. A vector network analyzer (VNA) comprising;

a test signal synthesizer having an output coupled to a test port;

a tracking synthesizer;

a first mixing means having a first input coupled to receive the output of the test signal synthesizer, a second input coupled to an output of the tracking synthesizer, and an output providing an incident IF signal; and a second mixing means having a first input coupled to receive a signal from the test port, a second input coupled to receive the output of the tracking synthesizer, and an output providing a reflected IF signal:

an analog to digital (A/D) converter;

a first synchronous detector including a series connected multiplier and integrator, the multiplier having a first input receiving the incident IF signal, and a second input, and the integrator having an output providing an incident real voltage signal to an input of the A/D converter;

a second synchronous detector including a series connected multiplier and integrator, the multiplier of the second synchronous detector having a first input receiving the incident IF signal, and a second input, and the integrator of the second synchronous detector having an output providing an incident imaginary voltage signal to an input of the A/D converter;

a third synchronous detector including a series connected multiplier and integrator, the multiplier of the third synchronous detector having a first input receiving the reflected IF signal, and a second input, and the integrator of the third synchronous detector having an output providing a reflected real voltage signal to an input of the A/D converter;

a fourth synchronous detector including a series connected multiplier and integrator, the multiplier of the fourth synchronous detector having a first input receiving the reflected IF signal, and a second input, and the integrator of the fourth synchronous detector having an output providing a reflected imaginary voltage signal to an input of the A/D converter; and a synchronous detector control means coupled for receiving the incident IF signal end providing a first phase reference output to the second input of the multipliers of the first and third synchronous detectors, and a second phase reference output with approximately a 90 degree phase difference from the first phase reference output to the second input of the multipliers of the second and fourth synchronous detectors.

24. The VNA of claim 23 wherein the synchronous detector control means is further coupled for receiving the incident imaginary voltage from the output of the integrator of the second synchronous detector and providing the first and second phase reference outputs so that the incident imaginary voltage signal does not change substantially over time.

25. The VNA of claim 24 wherein the synchronous detector control means comprises:

a comparator having a first input coupled by an integrator to receive the incident imaginary voltage from the output of the integrator the second synchronous detector, a second input receiving the incident IF signal and an output; and an I/Q synthesizer comprising:

an oscillator having a voltage control input and an output for providing an output with a frequency approximately four times a frequency of the incident IF signal based on a signal received at its voltage control input:

a phase detector having a first input connected to the output of the comparator and a second input connected receive the first phase reference output, the phase detector providing a voltage control signal coupled to the voltage control input of the oscillator based upon a phase comparison of the signals at the first and second inputs of the phase detector;

a first D-type flip-flop having a clock input receiving the oscillator output, a Q output providing the first phase reference output, and a D input; and a second D-type flip-flop having a clock input receiving the oscillator output, a D input receiving the Q output of the first D-type flip-flop, a Q output connected to the D input of the first D-type flip-flop and a Q output providing the second phase reference output.

26. The VNA of claim 23 wherein the A/D converter operates to accurately convert an input signal up to a maximum voltage, the VNA further comprising:

an A/D converter range maximizing means having a first input receiving a voltage reference approximately equal to the maximum voltage, a second input connected to the output of the integrator of the first synchronous detector, and an output providing an integrate signal at a beginning of a cycle of the incident IF signal and a reset signal when the incident real voltage reaches the maximum value, and wherein the first, second, third and fourth synchronous detectors each further comprise:

a first switch coupled for receiving the integrate signal from the A/D converter range maximizing means and for coupling the output of the multiplier of a respective one of the synchronous detectors to the input of the integrator of the respective one of the synchronous detectors, the first switch being controlled to close when the integrate signal is enabled and to open when the integrate signal is disabled; and a second switch coupled for receiving the reset signal from the A/D converter range maximizing means and for coupling the input to the output of the integrator of the respective one of the synchronous detectors, the second switch being controlled to close when the reset signal is enabled and to open when the reset signal is disabled.

27. The VNA of claim 26 wherein the A/D converter range maximizing means comprises:

a comparator having a first input connected to receive the voltage reference, a second input connected to receive the output of the integrator of the first synchronous detector and an output; and a processor receiving the output of the comparator and providing the integrate signal and the reset signal.

* * * * *

UNITED STATES PATENT AND TRADEMARK OFFICE
CERTIFICATE OF CORRECTION

PATENT NO. : 5,642,039
DATED : June 24, 1997
INVENTOR(S) : Donald A. Bradley
Frank Tiernan It is certified that error appears in the above-indentified patent and that said Letters Patent is hereby corrected as shown below:

Column 5, line 34, please insert a space between 8051 and microcontroller.

Column 6, line 67, between "may" and "divide" please delete "be".

Column 23, line 50, please remove the ",".

Column 24, line 33, please delete "end" and insert -- and --.

Column 26, line 45, please delete ";" and insert --:--.

Column 26, line 57, please delete ":" and insert --;--.

Column 27, line 21, please delete "end" and insert -- and --.

Signed and Sealed this

Twenty-third Day of September, 1997

Attest:

BRUCE LEHMAN

*Attesting Officer*   *Commissioner of Patents and Trademarks*